United States Patent
Kim et al.

(10) Patent No.: US 11,824,053 B2
(45) Date of Patent: Nov. 21, 2023

(54) ELECTRONIC DEVICE INCLUDING DISPLAY AND CAMERA DEVICE

(71) Applicant: Samsung Electronics Co., Ltd., Suwon-si (KR)

(72) Inventors: Hyunjea Kim, Suwon-si (KR); Changkeun Kim, Suwon-si (KR); Jaecheol Bae, Suwon-si (KR); Jeongyeol Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 374 days.

(21) Appl. No.: 17/096,290

(22) Filed: Nov. 12, 2020

(65) Prior Publication Data

US 2021/0151425 A1 May 20, 2021

(30) Foreign Application Priority Data

Nov. 18, 2019 (KR) .................... 10-2019-0147909

(51) Int. Cl.
*H01L 25/18* (2023.01)
*H10K 59/131* (2023.01)
*H04N 23/57* (2023.01)
*H10K 50/84* (2023.01)
*H10K 59/35* (2023.01)

(52) U.S. Cl.
CPC ............ *H01L 25/18* (2013.01); *H04N 23/57* (2023.01); *H10K 50/84* (2023.02); *H10K 59/131* (2023.02); *H10K 59/35* (2023.02)

(58) Field of Classification Search
None
See application file for complete search history.

(56) References Cited

U.S. PATENT DOCUMENTS

| 6,124,920 A | 9/2000 | Moseley et al. |
| 11,073,712 B2 | 7/2021 | Yeke Yazdandoost et al. |

(Continued)

FOREIGN PATENT DOCUMENTS

| CN | 110189627 A | 8/2019 |
| CN | 110299397 A | 10/2019 |

(Continued)

OTHER PUBLICATIONS

International Search Report dated Feb. 22, 2021, issued in International Patent Application No. PCT/KR2020/015845.

(Continued)

*Primary Examiner* — Michelle Mandala
*Assistant Examiner* — Jordan M Klein
(74) *Attorney, Agent, or Firm* — Jefferson IP Law, LLP

(57) ABSTRACT

An electronic device is provided. The electronic device includes a housing, a display panel, and a camera device. The housing may have an inner space. The display panel may be disposed in the inner space of the housing to be visible from an outside and may include a transmission area formed as a part of an active area thereof. The camera device may be disposed under the display panel such that the transmission area of the display panel is overlapped with an angle of view of the camera device. The transmission area contains a plurality of pixels or a plurality of wirings having an arrangement density lower than in a surrounding active area when the display panel is viewed from above. The display panel may include an opaque layer disposed thereunder, having a plurality of openings, and overlapped with the transmission area when the display panel is viewed from above.

23 Claims, 42 Drawing Sheets

(56) References Cited

U.S. PATENT DOCUMENTS

| | | |
|---|---|---|
| 2005/0117094 A1 | 6/2005 | Kim et al. |
| 2016/0154248 A1 | 6/2016 | Lee |
| 2017/0212613 A1 | 7/2017 | Hwang et al. |
| 2017/0270342 A1 | 9/2017 | He et al. |
| 2019/0206953 A1 | 7/2019 | Hsieh et al. |
| 2019/0237521 A1 | 8/2019 | Ju |
| 2019/0310724 A1* | 10/2019 | Yeke Yazdandoost ............ H10K 59/65 |
| 2019/0317629 A1 | 10/2019 | Jung et al. |
| 2020/0219967 A1 | 7/2020 | Lou et al. |
| 2021/0036078 A1* | 2/2021 | Sun ............... H10K 59/352 |
| 2021/0065625 A1* | 3/2021 | Wang ............. G09G 3/3233 |

FOREIGN PATENT DOCUMENTS

| | | |
|---|---|---|
| JP | H10-115804 A | 5/1998 |
| JP | 2005-331825 A | 12/2005 |
| KR | 10-2003-0086362 A | 11/2003 |
| KR | 10-2005-0052802 A | 6/2005 |
| KR | 10-2015-0073664 A | 7/2015 |
| KR | 10-2017-0087635 A | 7/2017 |
| KR | 10-2019-0120051 A | 10/2019 |
| TW | 201921064 A | 6/2019 |

OTHER PUBLICATIONS

Extended European Search Report dated Sep. 5, 2022, issued in European Patent Application No. 20889238.0.

* cited by examiner

ELECTRONIC DEVICE INCLUDING DISPLAY AND CAMERA DEVICE

CROSS-REFERENCE TO RELATED APPLICATION(S)

This application is based on and claims priority under 35 U.S.C. § 119(a) of a Korean patent application number 10-2019-0147909, filed on Nov. 18, 2019, in the Korean Intellectual Property Office, the disclosure of which is incorporated by reference herein its entirety.

BACKGROUND

1. Field

The disclosure relates to an electronic device including a display and a camera device. More particularly, the disclosure relates an electronic device in which a display and a camera device are configured to improve an image quality by adjusting a diffraction characteristic of light incident through a transmission area of the display.

2. Description of Related Art

With the growth of related technologies, a great variety of electronic devices such as mobile electronic devices has been developed and popularized. Recently, such electronic devices have tended to have a touch-sensitive display with a large-sized screen for wide visibility and convenient manipulation. Also, the electronic devices may each have at least one camera device. For example, such a camera device may be disposed around or through the display in the electronic device.

Normally, the electronic device may include a display seen to the outside through at least a part of a cover member (also referred to as a front plate, a glass window, or a front cover). To meet the need of a large-sized screen, the display has a gradually increasing display area and comes to be exposed through the substantially entire area of the cover member. In response to this trend of an increasing display area, the arrangement of various electronic components, e.g., at least one camera device, disposed through the cover member also needs to be changed accordingly. This is because if the camera device is disposed in a black matrix (BM) area (or an inactive area) of the cover member other than the display area, there is a limitation in increasing the display area.

In order to expand the display area, the camera device may be placed under an active area of the display. In this case, the display may have a transmission area corresponding to the angle of view of the camera device. The transmission area of the display not only performs a display function, but also has pixels and/or wirings arranged at a lower density than surrounding areas to satisfy the transmittance required by the camera device.

However, this transmission area of the display having a low arrangement density may often cause diffraction with various frequencies due to pixels and/or wirings having an irregular arrangement structure. In addition, such diffraction may cause a phenomenon that a modulation transfer function (MTF) for each frequency is not linear due to destructive interference but fluctuates in a sine wave (generally lowers). For this reason, if the camera device is disposed under the transmission area of the display, the image quality of the camera device may be deteriorated.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device that includes a display and a camera device.

Various embodiments of the disclosure may provide an electronic device in which a display and a camera device are configured to improve an image quality by adjusting a diffraction characteristic of light incident through a transmission area of the display.

Additional aspects will be set forth in part in the description which follows and, in part, will be apparent from the description, or may be learned by practice of the presented embodiments.

In accordance with an aspect of the disclosure, an electronic device is provided. The electronic device includes a housing having an inner space, a display panel disposed in the inner space of the housing to be visible from an outside and including a transmission area formed as a part of an active area thereof, and a camera device disposed under the display panel such that the transmission area of the display panel is overlapped with an angle of view of the camera device. The transmission area may contain a plurality of pixels and/or a plurality of wirings having an arrangement density lower than in a surrounding active area when the display panel is viewed from above. The display panel may include an opaque layer disposed thereunder, having a plurality of openings, and overlapped with the transmission area when the display panel is viewed from above.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
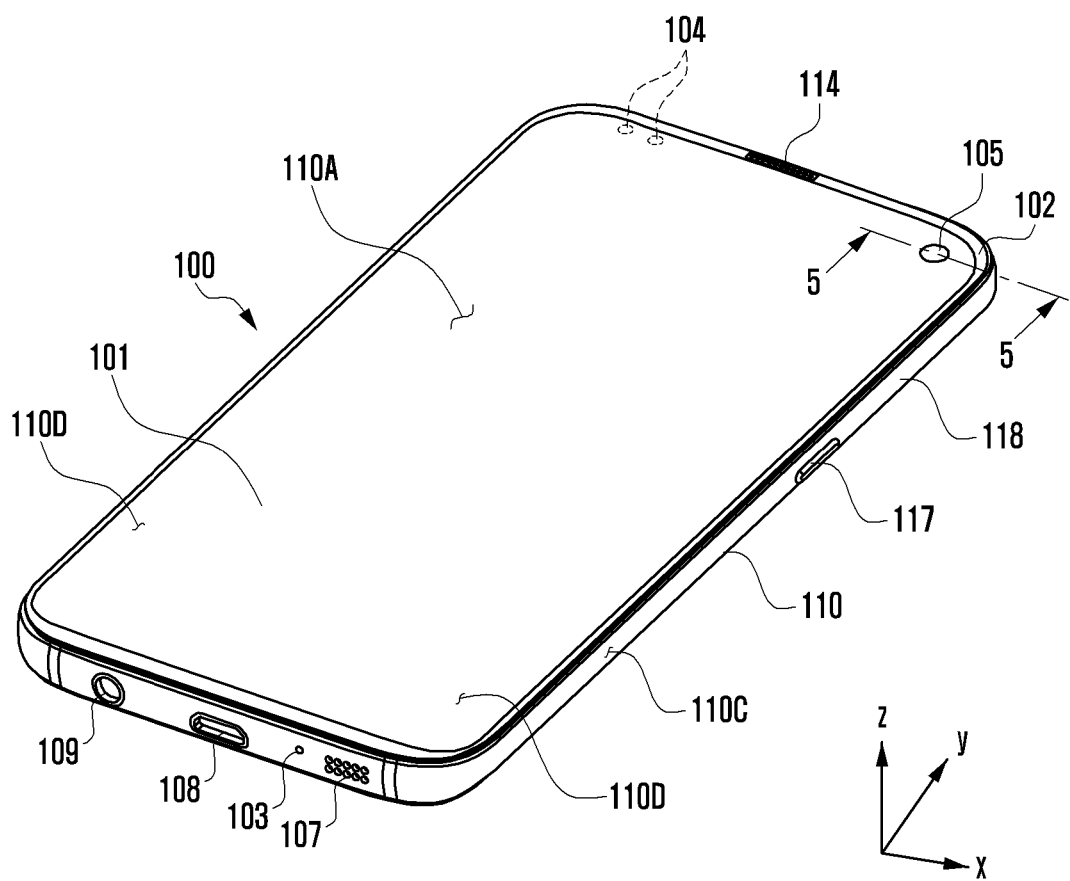
FIG. 1 is a perspective view illustrating a front surface of a mobile electronic device according to an embodiment of the disclosure.

FIG. 1 illustrates a perspective view showing a front surface of a mobile electronic device according to an embodiment of the disclosure.

Figure 2:
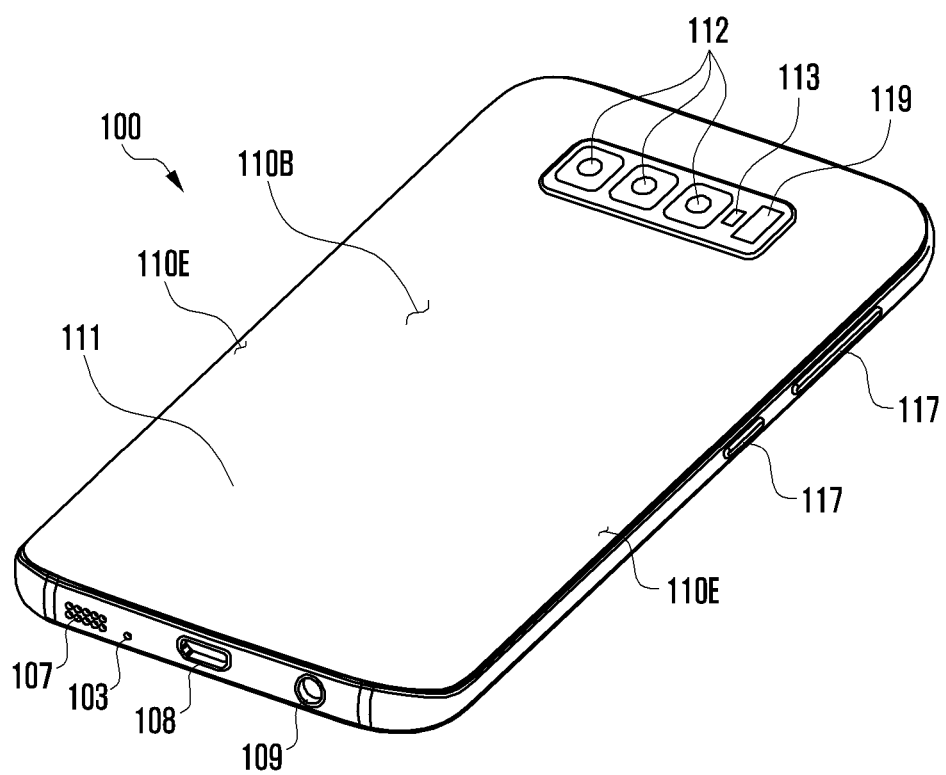
FIG. 2 is a perspective view illustrating a rear surface of a mobile electronic device shown in FIG. 1 according to an embodiment of the disclosure.

FIG. 2 illustrates a perspective view showing a rear surface of the mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector holes 108 and 109. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device. At least one of the audio module 114, the sensor module 104, the camera module 105, a fingerprint sensor (not shown), and the light emitting element may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Some sensor modules of camera modules 105 and 212, some sensor modules 104 of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
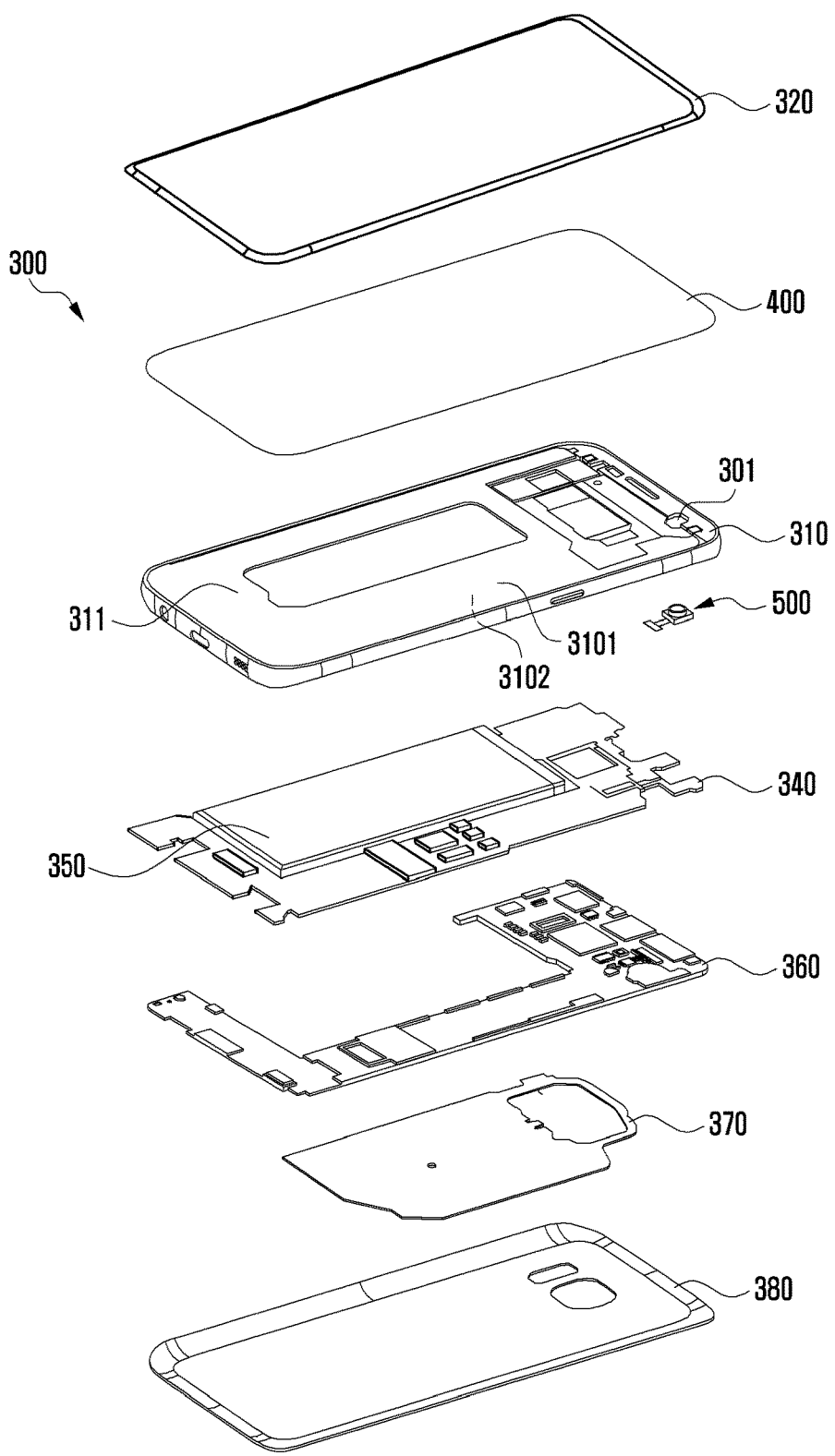
FIG. 3 is an exploded perspective view illustrating the mobile electronic device shown in FIGS. 1 and 2 according to an embodiment of the disclosure.

FIG. 3 illustrates an exploded perspective view showing a mobile electronic device shown in FIG. 1 according to an embodiment of the disclosure.

Referring to FIG. 3, a mobile electronic device 300 may include a lateral bezel structure 310, a first support member 311 (e.g., a bracket), a front cover 320, a display 400, an electromagnetic induction panel (not shown), a printed circuit board (PCB) 340, a battery 350, a second support member 360 (e.g., a rear case), an antenna 370, and a rear cover 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 400 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear cover 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

According to various embodiments, the first support member 311 of the lateral member 310 may include a first surface 3101 facing the front cover 320, and a second surface 3102 facing the rear cover 380 and being opposite to the first surface 3101. According to an embodiment, a camera device 500 (e.g., the camera device 105 in FIG. 1) may be disposed between the first support member 311 and the rear cover 380. According to an embodiment, the camera device 500 may be disposed to be protruded or exposed toward the front cover 320 via a through-hole 301 formed from the first surface 3101 to the second surface 3102 of the first support member 311. According to an embodiment, a portion of the camera device 500 protruded via the through-hole 301 may be disposed to detect an external environment at a corresponding position of the display 400. In another embodiment where the camera device 500 is disposed between the display 400 and the first support member 311, the through-hole 301 may be unnecessary.

Hereinafter, an arrangement relationship between the display 400 and the camera device 500 in the electronic device 300 will be described in detail.

Figure 4:
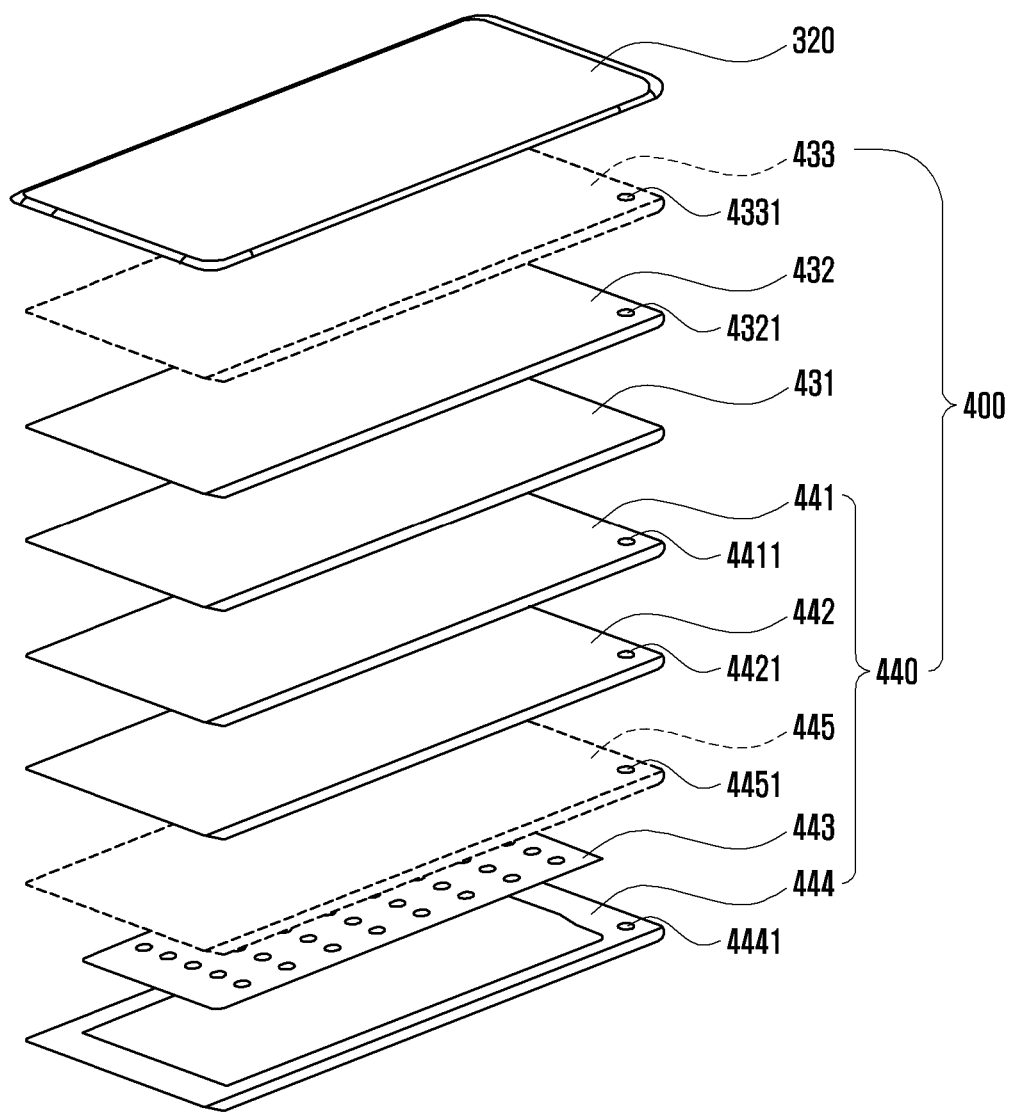
FIG. 4 is an exploded perspective view illustrating a display according to an embodiment of the disclosure.

FIG. 4 is an exploded perspective view illustrating a display according to an embodiment of the disclosure.

The display 400 shown in FIG. 4 may be similar, at least in part, to the display 101 shown in FIG. 1, or may include other embodiments of the display.

Referring to FIG. 4, a display 400 may include a display panel 431, a polarizer (POL) 432 (e.g., a polarizing film) disposed through an adhesive member (e.g., the adhesive member 410 in FIG. 5) on a rear surface of the front cover 320 (also referred to as a front plate, a glass plate, a first cover member, or a cover member), and at least one additional layer 440 attached to a rear surface of the display panel 431. According to an embodiment, the adhesive member may include an optical clear adhesive (OCA), a pressure sensitive adhesive (PSA), a heat-reactive adhesive, a normal adhesive, or a double-sided tape. According to an embodiment, the display panel 431 and the POL 432 may be integrally formed.

According to various embodiments, the display 400 may include a control circuit (not shown). According to an embodiment, the control circuit may include a flexible printed circuit board (FPCB) for electrically connecting a main board (e.g., the PCB 340 in FIG. 3) of an electronic device (e.g., the electronic device 300 in FIG. 3) and the display panel 431, and a display driver IC (DDI) mounted on the FPCB. According to an embodiment, the display 400 may further include a touch panel 433. In an embodiment where the display 400 operates as a touch display of an in-cell or on-cell type depending on the arrangement position of the touch panel 433, the control circuit may include a touch display driver IC (TDDI). In another embodiment, the display 400 may also include a fingerprint sensor (not shown) disposed near the control circuit. According to an embodiment, the fingerprint sensor may include an ultrasonic or optical fingerprint sensor capable of recognizing, through a hole formed at least partially in some of components of the display 400, a fingerprint of a finger that is in contact with or close to the outer surface of the front cover 320.

According to various embodiments, the at least one additional layer 440 may include one or more polymer members 441 and 442 disposed on the rear surface of the display panel 431, at least one functional member 443 disposed on the rear surface of the polymer members 441 and 442, and a conductive member 444 disposed on the rear surface of the at least one functional member 443. According to an embodiment, the one or more polymer members 441 and 442 may include a light-shielding layer 441 (e.g., a black layer having an uneven pattern) and/or a cushion layer 442. The light-shielding layer 441 not only removes air bubbles that may occur between the display panel 431 and underlying layers, but also blocks light generated from the display panel 431 or light incident from the outside. The cushion layer 442 is disposed to relieve a shock. According to an embodiment, the at least one functional member 443 may include, for example, a graphite sheet for heat dissipation, an added display, a force-touch FPCB, a fingerprint sensor FPCB, a communication antenna radiator, a conductive/non-conductive tape, and/or an open cell sponge. According to an embodiment, the conductive member 444 may be a metal plate used for reinforcing the rigidity of an electronic device (e.g., the electronic device 300 in FIG. 3), shielding ambient noise, and dissipating heat released from surrounding components. In an embodiment, the conductive member 444 may include copper (Cu), aluminum (Al), magnesium (Mg), stainless steel (SUS), or a clad (i.e., a laminated stack of different kinds of metals such as SUS and Al). In another embodiment, the display 400 may further include a detection member 445 for detecting an input action by a writing member (e.g., an electronic pen) of an electromagnetic induction type. According to an embodiment, the detection member 445 may include a digitizer. According to an embodiment, the detection member 445 may be disposed between the lower polymer member 442 and the functional member 443. In another embodiment, the detection member 445 may be disposed between the display panel 431 and the upper polymer member 441.

Figure 5A:
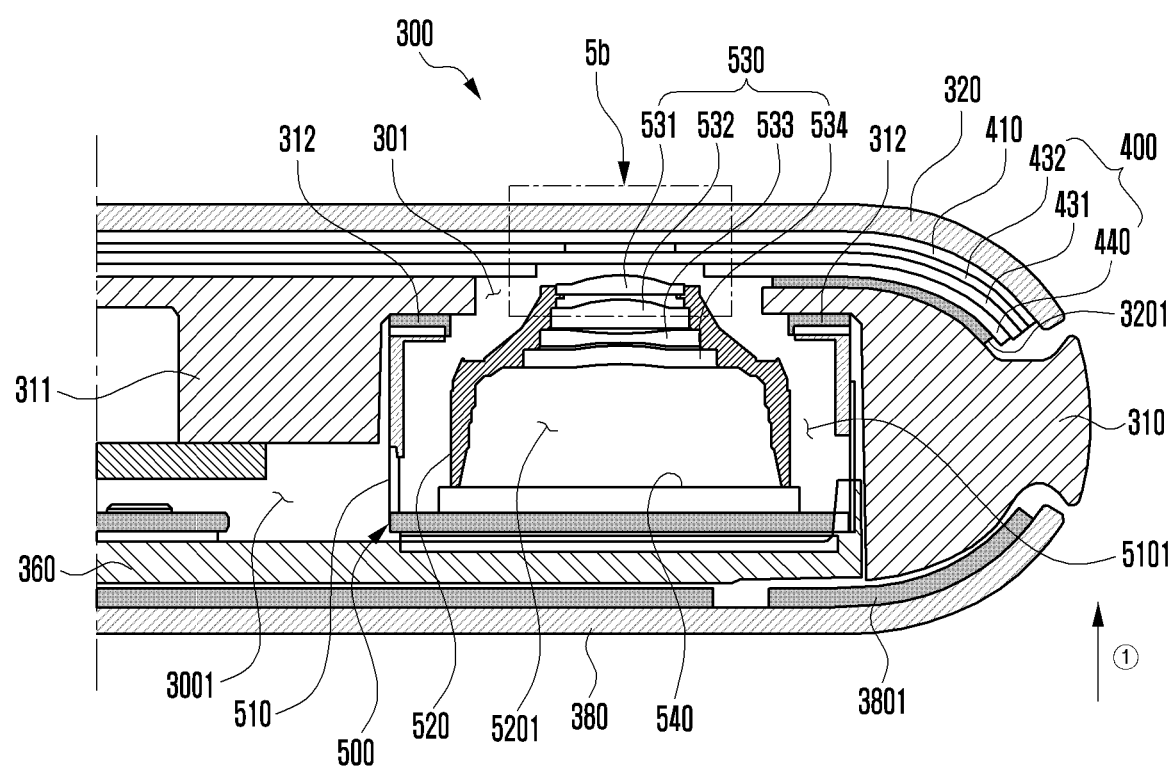
FIG. 5A is a cross-sectional view partially illustrating an electronic device by being taken along the line 5-5 of FIG. 1 according to an embodiment of the disclosure.

According to various embodiments, the additional layer 440 may have openings 4411, 4421, 4451, and 4441 formed at positions corresponding to the camera device (e.g., the camera device 500 in FIG. 5A). According to an embodiment, the camera device 500 may be disposed to be close to the rear surface of the display panel 431 through the openings 4411, 4421, 4451, and 4441. According to an embodiment, the POL 432 and the touch panel 433 disposed on the display panel 431 may also have openings 4321 and 4331 formed at corresponding positions to prevent performance degradation of the camera device 500 due to a refractive index. In another embodiment, the POL 432 and/or the touch panel 433 may be treated transparently or have a removed polarization characteristic at a position corresponding to the camera device 500. In another embodiment, a layer having no opening (e.g., the display panel 431 or the touch panel 433) may include a coating layer capable of index matching in order to minimize a difference in refractive index. According to various embodiments, the display 400 may include an organic light emitting diode (OLED) display or a liquid crystal display (LCD).

According to various embodiments, in the display panel 431, a region facing the openings 4411, 4421, 4451, and 4441 is a part of the active area and may be formed as a transmission area (e.g., the transmission area A1 in FIG. 5B) having a certain transmittance. According to an embodiment, the transmission area (e.g., the transmission area A1 in FIG. 5B) may be formed to have a transmittance in the range of about 5% to about 20%. The transmission area (e.g., the transmission area A1 in FIG. 5B) may be overlapped, at least in part, with an effective area (e.g., an angle of view) of the camera device through which light for forming an image at the image sensor can pass. According to an embodiment, in the display panel 431, the remaining active area (e.g., the surrounding active area A2 in FIG. 5B) excluding the transmission area (e.g., the transmission area A1 in FIG. 5B) may have a transmittance of about 5% or less.

Figure 5B:
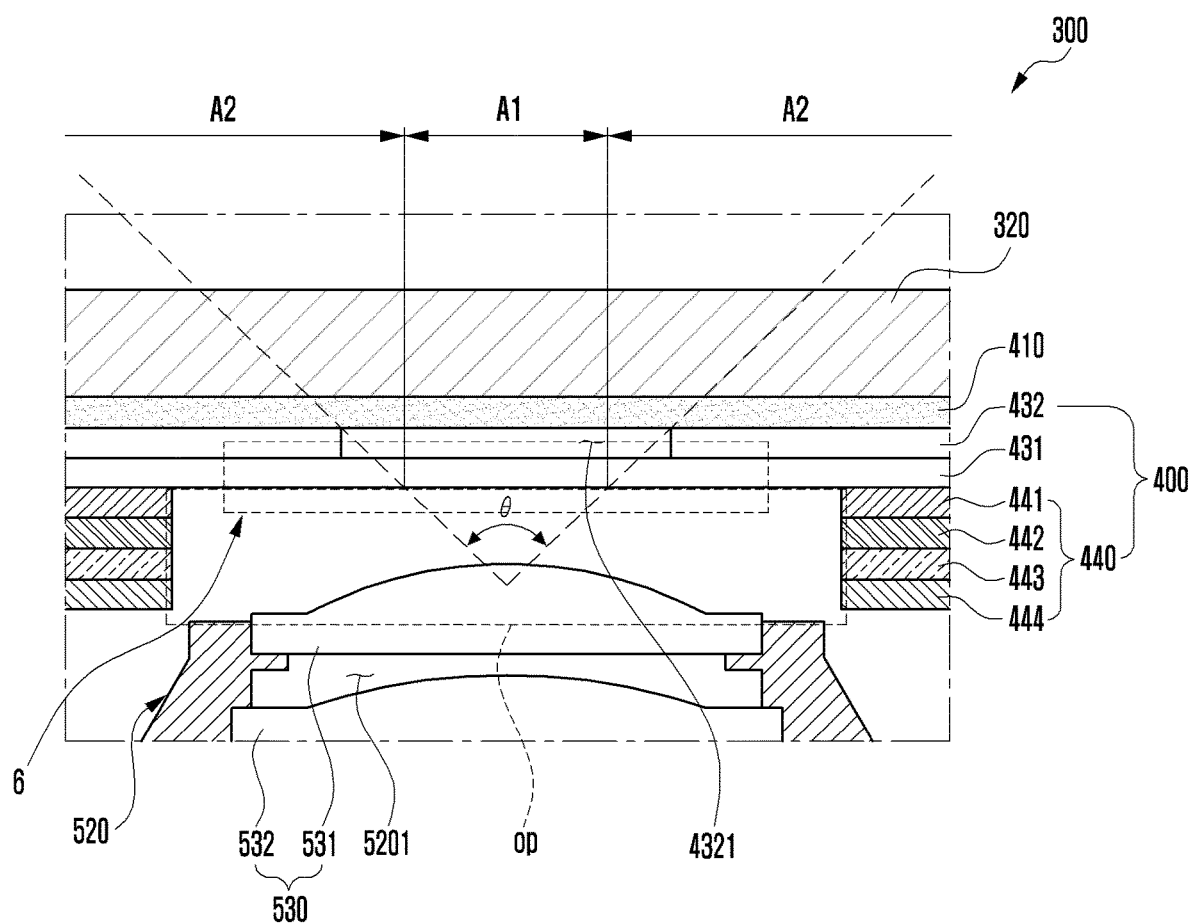
FIG. 5B is an enlarged view illustrating a portion '5b' of FIG. 5A according to an embodiment of the disclosure.
Figure 7A:
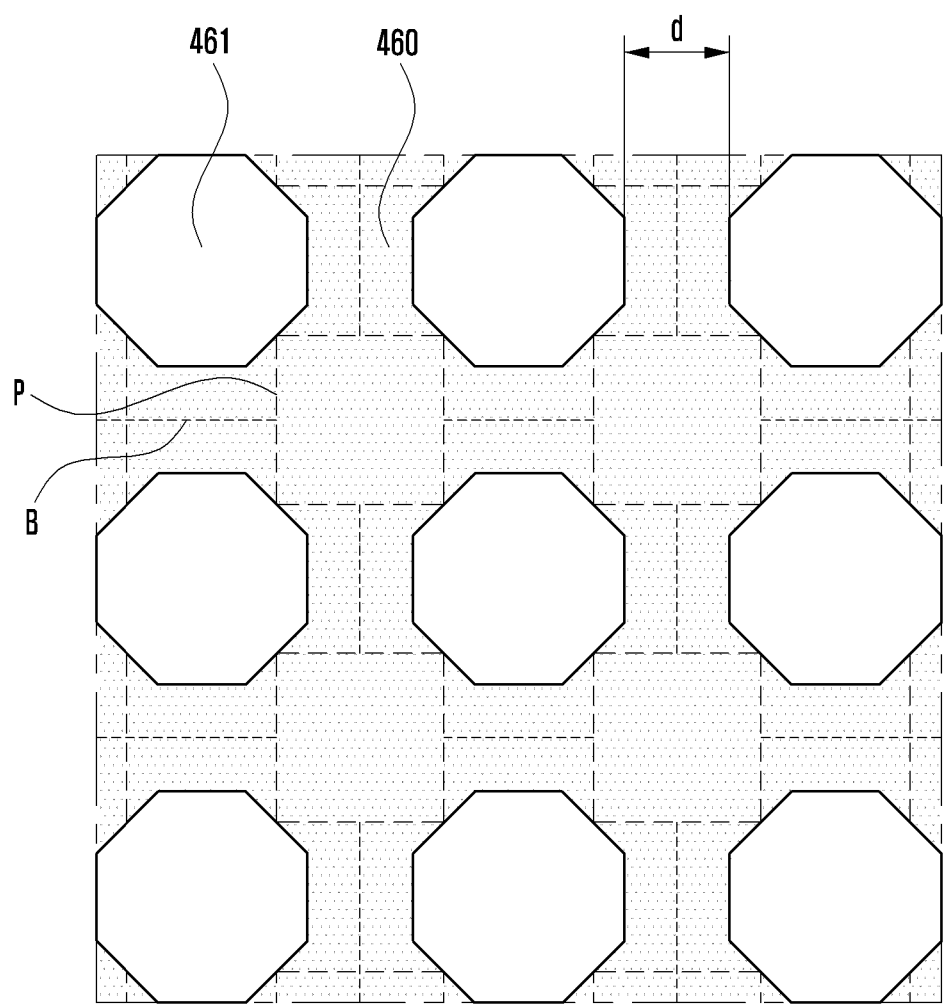
FIGS. 7A, 7B, 8A, 8B, 9A and 9B are diagrams illustrating various shapes of an opening and corresponding graphs of modulation transfer function (MTF) according to various embodiments of the disclosure.

According to various embodiments, in the display panel 431, the transmission area (e.g., the transmission area A1 in FIG. 5B) may be formed to have pixels (e.g., the pixels P in FIG. 7A) and/or wirings (e.g., the wirings B in FIG. 7A)

arranged at a lower density than the surrounding active area (e.g., the surrounding active area A2 in FIG. 5B). According to an embodiment, the transmission area (e.g., transmission area A1 in FIG. 5B) having pixels and/or wirings irregularly arranged at a lower density may cause a large undesired diffraction of incident light. This may further cause a phenomenon that the modulation transfer function (MTF) for each frequency is not constant and decreases at low frequencies.

Figure 6:
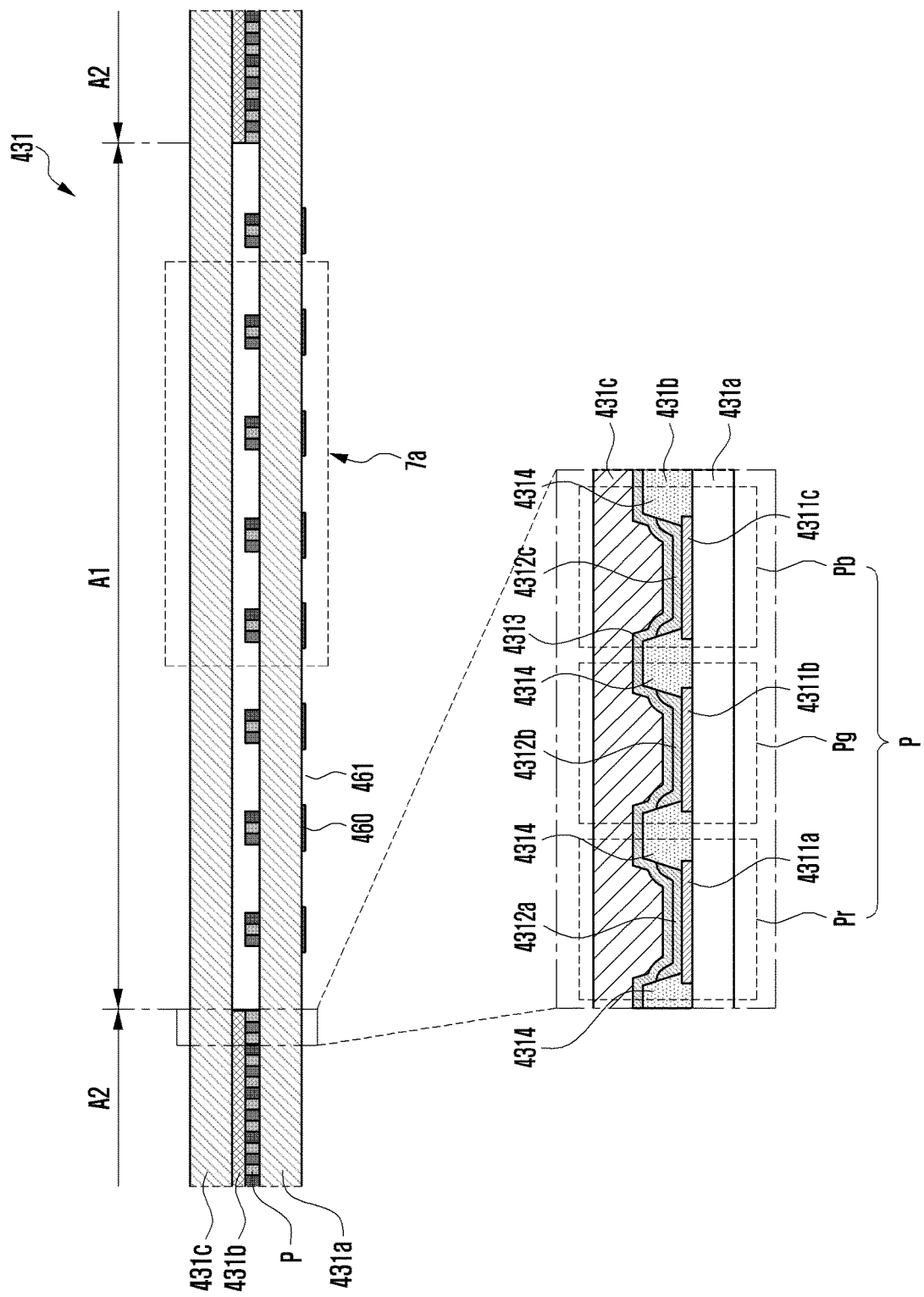
FIG. 6 is an enlarged view illustrating a portion '6' of FIG. 5B according to an embodiment of the disclosure.

According to an embodiment, the display 400 may further include an opaque layer (e.g., the opaque layer 460 in FIG. 6), which is disposed under the display panel 431 to be overlapped with the transmission area (e.g., the transmission area A1 in FIG. 5B) and has a plurality of openings (e.g., the openings 461 in FIG. 6). According to an embodiment, the shape, size, arrangement density, and/or arrangement interval of the openings (e.g., the openings 461 in FIG. 6) of the opaque layer (e.g., the opaque layer 460 in FIG. 6) may be appropriately adjusted. As a result, the camera device can reduce the degree of diffraction of light incident through the transmission area (e.g., the transmission area A1 in FIG. 5B) while maintaining high MTF characteristics, thereby providing an improved image.

FIG. 5A is a cross-sectional view partially illustrating an electronic device by being taken along the line 5-5 of FIG. 1 according to an embodiment of the disclosure.

FIG. 5B is an enlarged view illustrating a portion '5b' of FIG. 5A according to an embodiment of the disclosure.

In describing FIGS. 5A and 5B, an UB (unbreakable) type OLED (organic light-emitting diode) display (e.g., a curved display) will be used as an example. The following description may also be applied to any other type display such as, for example, a flat type display based on OCTA (on-cell touch AMOLED (active matrix OLED)).

Referring to FIGS. 5A and 5B, the electronic device 300 may include the front cover 320 (also referred to as a cover member, a front plate, a front window, or a first plate) facing a first direction (denoted by ①), the rear cover 380 (also referred to as a rear cover member, a rear plate, a rear window, or a second plate) facing a direction opposite to the front cover 320, and the lateral member 310 surrounding an inner space 3001 between the front cover 320 and the rear cover 380. According to an embodiment, the electronic device 300 may include a first waterproof member 3201 disposed between the additional layer 440 of the display 400 and the lateral member 310. According to an embodiment, the electronic device 300 may include a second waterproof member 3801 disposed between the lateral member 310 and the rear cover 380. The first waterproof member 3201 and the second waterproof member 3801 may prevent foreign matter or moisture from entering the inner space 3001 of the electronic device 300. In another embodiment, such a waterproof member may be disposed on at least a portion of a mounting support structure between the camera device 500 and the lateral member 310.

According to various embodiments, the lateral member 310 may further include the first support member 311 extended at least in part into the inner space 3001 of the electronic device 300. According to an embodiment, the first support member 311 may be formed by a structural coupling with the lateral member 310. According to an embodiment, the first support member 311 may support the camera device 500 such that the camera device 500 is disposed near the rear surface of the display panel 431 through an opening (e.g., the opening OP in FIG. 5B) of the additional layer 440.

According to various embodiments, the camera device 500 may include a camera housing 510, a lens housing 520, a plurality of lenses 530 (i.e., 531, 532, 533, and 534), and at least one image sensor 540. The camera housing 510 may be formed to have an inner space 5101. The lens housing 520 may be formed to have an inner space 5201, disposed in the inner space 5101 of the camera housing 510, and protruded at least in part in a display direction (denoted by ①). The plurality of lenses 530 may be disposed at regular intervals in the inner space 5201 of the lens housing 520. The at least one image sensor 540 may be disposed in the inner space 5101 of the camera housing 510 to acquire at least part of light passing through the plurality of lenses 530. According to an embodiment, when the camera device 500 has an auto focus (AF) function, the lens housing 520 may move in the camera housing 510 through a certain driver so that a distance from the display panel 431 is variable. In this case, for the AF function, separate drivers may be disposed to vary the position of at least one of the plurality of lenses 530. In another embodiment, the camera device 500 may not have the camera housing 510 to reduce a camera arrangement space. In this case, the lens housing 520 may be directly disposed with the first support member 311 through an alignment process. For example, the camera device 500 may be aligned with the through-hole 301 of the first support member 311 and then attached to the rear surface of the first support member 311 through an adhesive member 312 (e.g., a bonding member or a tape member).

According to various embodiments, the display 400 may include the touch panel (e.g., the touch panel 433 in FIG. 4), the POL 432, the display panel 431, the light-shielding layer 441, the cushion layer 442, the digitizer (e.g., the detection member 445 in FIG. 4), the functional member 443, and/or the conductive member 444. According to an embodiment, the camera device 500 may be supported by the second support member 360 (e.g., a rear case) further disposed in the inner space 3001 of the electronic device 300.

As shown in FIG. 5B, the electronic device 300 may include the adhesive member 410, the POL 432, the display panel 431, and the additional layer 440, which are sequentially disposed between the lateral member 310 and the rear surface of the front cover 320. According to an embodiment, when the front cover 320 is viewed from above, the POL 432 may have an opening 4321 formed to improve the optical transmittance of the camera device 500. In another embodiment, the adhesive member 410 disposed on the POL 432 may also have an at least partially removed portion corresponding to the opening 4321. In another embodiment, the opening 4321 formed in the POL 432 may be filled with a material (e.g., an index matching material) for matching a refractive index according to an increase in interfacial reflection. In yet another embodiment, in the POL 432, a portion corresponding to the plurality of lenses 530 may not have the opening 4321 and instead have a high transmittance. For example, at least a portion of the POL 432 (e.g., the portion corresponding to the plurality of lenses 530) may be formed of a material having a transmittance different from that of the other portion of the POL 432 or composed of any other member capable of increasing a transmittance. According to an embodiment, the additional layer 440 may have an opening OP formed in a portion overlapped at least in part with the plurality of lenses 530 when the front cover 320 is viewed from above. According to an embodiment, the opening OP formed in the additional layer 440 may be a single integrated opening formed by stacking an opening (e.g., the opening 4411 in FIG. 4) of the light-shielding layer 441, an opening (e.g., the opening 4421 in FIG. 4) of the buffer layer 442, an opening (e.g., the opening 4431 in FIG. 4) of the functional member 443, and an opening (e.g., the opening 4441 in FIG. 4) of the conductive member 444. According to an embodiment, such openings may have different sizes, depending on the shape of the camera device 500.

According to various embodiments, the display panel 431 may include the active area (i.e., areas A1 and A2). According to an embodiment, the display panel 431 may include the transmission area A1, which is a part of the active area and is disposed to be overlapped with the angle of view (θ) of the underlying camera device 500 when the display 400 is viewed from above. According to an embodiment, the transmission area A1 may be formed to have a higher transmittance than that of the surrounding active area A2. For example, the transmission area A1 may be formed to have a transmittance in the range of 5% to 20% through rearrangement of pixels and/or wirings in the display panel 431. According to various embodiments, in the transmission area A1, an opaque layer (e.g., the opaque layer 460 in FIG. 6) having a plurality of openings (e.g., the openings 461 in FIG. 6) may be disposed under the display panel 431. According to an embodiment, the transmittance of the transmission area A1 may be determined based on adjusting at least one of the shape, size, arrangement density, and/or arrangement interval of the openings (e.g., the openings 461 in FIG. 6) of the opaque layer (e.g., the opaque layer 460 in FIG. 6).

FIG. 6 is an enlarged view illustrating a portion '6' of FIG. 5B according to an embodiment of the disclosure.

Referring to FIG. 6, the display panel 431 may include a substrate layer 431a, an intermediate layer 431b stacked on the substrate layer 431a, and an encapsulation layer 431c stacked on the intermediate layer 431b. According to an embodiment, the display panel 431 includes a plurality of pixels P in which a first sub-pixel region Pr (pixel red), a second sub-pixel region Pg (pixel green), and a third sub-pixel region Pb (pixel blue) are defined as one pixel P. According to an embodiment, an area in which the plurality of pixels P are disposed may include the active area of the display panel 431.

According to various embodiments, the display panel 431 may include, in the intermediate layer 431b, a first pixel electrode 4311a, a second pixel electrode 4311b, and a third pixel electrode 4311c, which are disposed on the substrate layer 431a to correspond to the first sub-pixel region Pr, the second sub-pixel region Pg, and the third sub-pixel region Pb, respectively. According to an embodiment, the display panel 431 may further include, in the intermediate layer 431b, a first organic material layer 4312a, a second organic material layer 4312b, and a third organic material layer 4312c, which are disposed on the first to third pixel electrodes 4311a, 4311b, and 4311c, respectively. According to an embodiment, the first to third sub-pixel regions Pr, Pg, and Pb may be partitioned by a pixel define layer 4314 formed of an insulating material, and a counter electrode 4313 may be commonly disposed on the first to third organic material layers 4312a, 4312b, and 4312c. According to an embodiment, the first to third pixel electrodes 4311a, 4311b, and 4311c may include a reflective electrode containing a reflective layer.

According to various embodiments, each of the first to third organic material layers 4312a, 4312b, and 4312c may include an organic emission layer that emits light of a first color, a second color, or a third color. According to an embodiment, the organic emission layer may be disposed between a pair of vertically stacked common layers. According to an embodiment, one of the common layers may include a hole injection layer (HIL) and/or a hole transport layer (HTL), and the other common layer may include an electron transport layer (ETL) and/or an electron injection layer (EIL). This is, however only, and the common layer may further include various functional layers in addition to the organic emission layer. In an embodiment, the first to third colors may be red, green, and blue, respectively. In another embodiment, any combination of various colors, which can resultantly emit white light, other than a combination of red, green, and blue may be also used.

According to various embodiments, the counter electrode 4313 may be formed of a transparent or translucent electrode, which may contain one or more materials selected from silver (Ag), aluminum (Al), magnesium (Mg), lithium (Li), calcium (Ca), copper (Cu), LiF/Ca, LiF/Al, MgAg, or CaAg, and may be formed as a thin film having a thickness of several to tens of nanometers. According to an embodiment, light emitted from the first to third organic emission layers included in the first to third organic material layers 4312a, 4312b, and 4312c is emitted toward the counter electrode 4313 directly or after being reflected by the first to third pixel electrodes 4311a, 4311b, and 4311c.

According to various embodiments, the substrate layer 431a may include electrical connection members electrically connected to the first to third pixel electrodes 4311a, 4311b, and 4311c, respectively. According to an embodiment, the electrical connection member may include a thin film transistor (TFT) or a low temperature passivation transistor (LTPS). According to an embodiment, the encapsulation layer 431c may be disposed on the counter electrode 4313 to protect it. In another embodiment, an additional base layer (not shown) may be disposed under the substrate layer 431a. According to an embodiment, the substrate layer 431a and/or the base layer may include a transparent insulating substrate. For example, the substrate layer 431a and/or the base layer may be formed of a glass substrate, a quartz substrate, or a transparent resin substrate. The transparent resin substrate may be formed of a polyimide-based resin, an acrylic-based resin, a polyacrylate-based resin, a polycarbonate-based resin, and a polyether-based resin, a sulfonic acid-based resin, or a polyethyleneterephthalate-based resin.

According to various embodiments, in the intermediate layer 431b between the substrate layer 431a and the encapsulation layer 431c within the transmission area A1, the display panel 431 may include a plurality of pixels P that are rearranged to have an arrangement density lower than that of the surrounding active area A2. In the transmission area A1, the intermediate layer 431b may remain or may be omitted. According to an embodiment, in the transmission area A1, the display panel 431 may include an opaque layer 460 disposed under (i.e., on the rear surface of) the display panel 431. According to an embodiment, the opaque layer 460 may include a opaque (e.g., black or colored) metal layer. In another embodiment, at least a portion of the opaque layer 460 may be disposed in a boundary region between the transmission area A1 and the surrounding active area A2. According to an embodiment, the metal layer may be formed on the rear surface of the display panel 431 through a deposition process. According to an embodiment, the opaque layer 460 may have a plurality of openings 461, and the transmittance of the transmission area A1 may be determined depending on the shape, size, arrangement density, and/or arrangement interval of the plurality of openings 461. According to an embodiment, the plurality of openings 461 may be formed 7a the same or different shapes, sizes, arrangement structures, and/or arrangement intervals. According to an embodiment, when the display panel 431 is viewed from above, the plurality of pixels P and/or the plurality of wirings (e.g., the wirings B in FIG. 7A) may be arranged to avoid the plurality of openings 461, that is, to be overlapped with a non-transmission portion which is defined as the opaque layer 460 except the openings 461. In another embodiment, when the display panel 431 is viewed from above, the plurality of pixels P and/or the plurality of wirings (e.g., the wirings B in FIG. 7A) may be arranged to be overlapped at least partially with a transmission portion which is defined as the openings 461.

According to various embodiments, the display panel 431 may be formed to have a transmittance corresponding to a pixel arrangement density in a range of about 100 pixel per inch (ppi) to about 300 ppi through the plurality of openings 461 in the transmission area A1. According to an embodiment, the transmittance of the transmission area A1 may be greater than the transmittance of the surrounding active area A2 and be smaller than the transmittance corresponding to the pixel arrangement density that one pixel is disposed in an area capable of accommodating 16 pixels. According to an embodiment, the transmittance of the transmission area A1 may correspond to the pixel arrangement density that one pixel is disposed in an area capable of accommodating 4 pixels. According to an embodiment, in the transmission area A1, a ratio of the transmission portion formed by the opening 461 to the non-transmission portion formed by the opaque layer 460 (i.e., transmission portion/non-transmission portion) may range from about 1 to 500.

FIGS. 7A to 9B are diagrams illustrating various shapes of an opening and corresponding graphs of modulation transfer function (MTF) according to various embodiments of the disclosure.

Figure 8A:
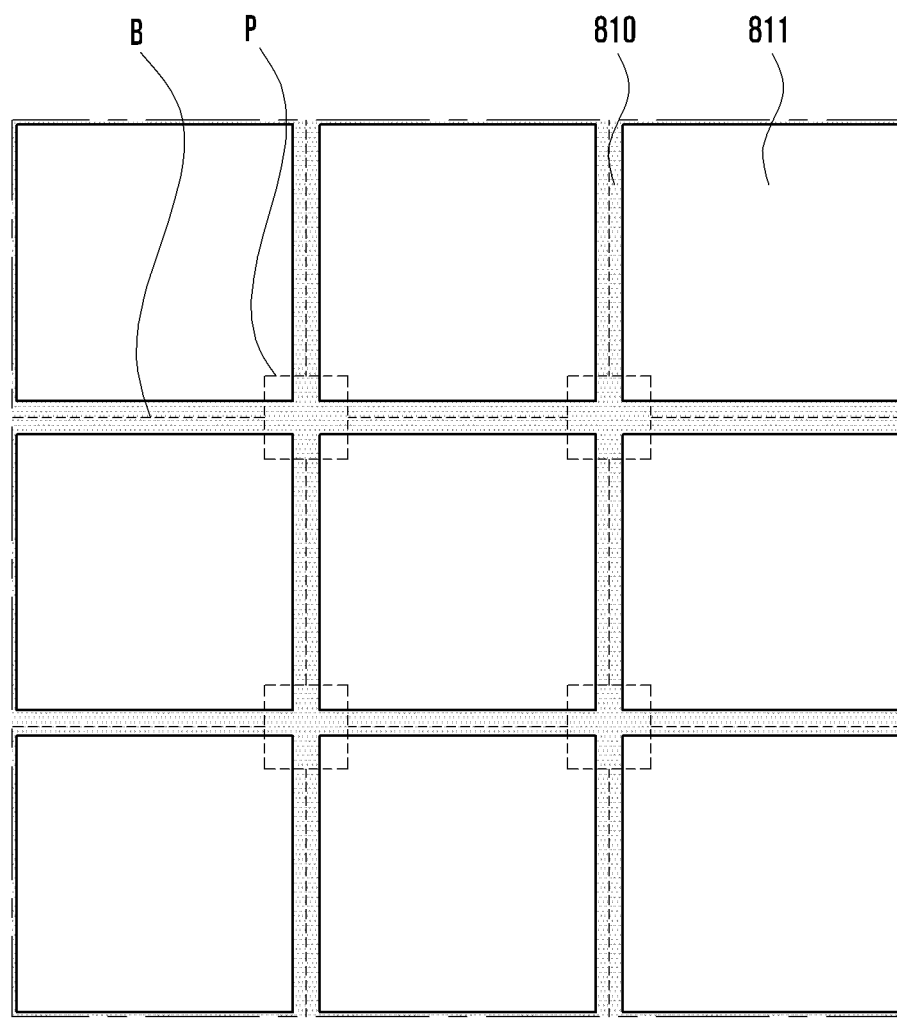
Figure 9A:
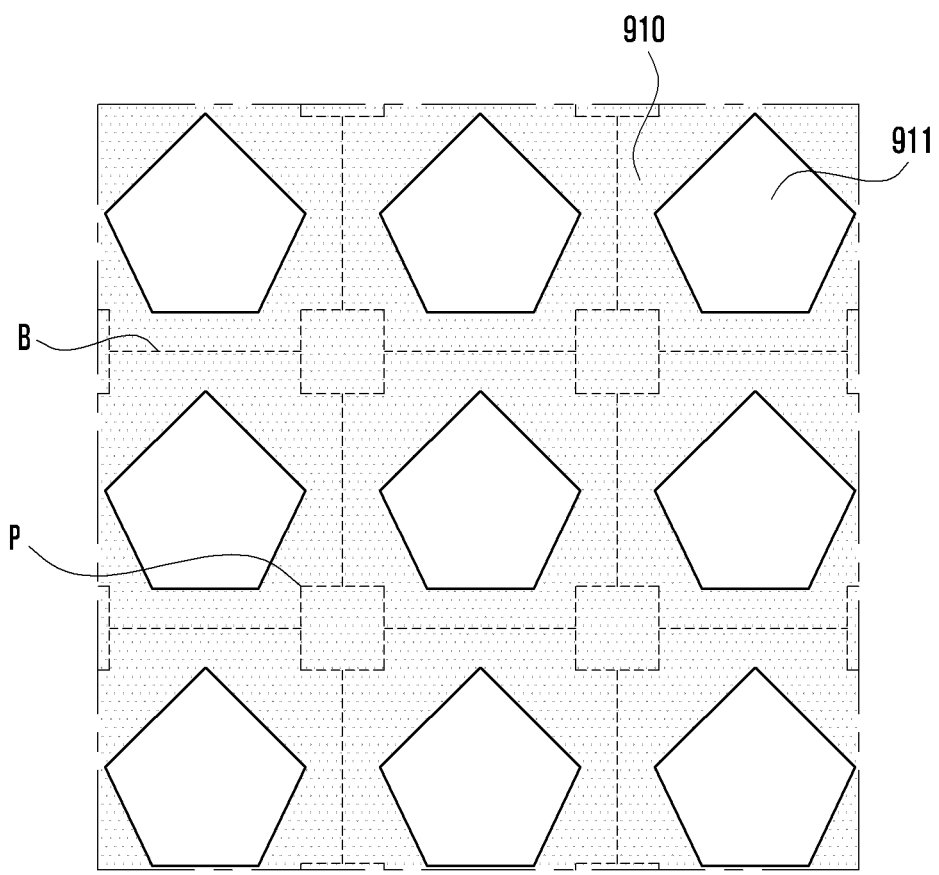

The openings 461, 811, and 911, respectively shown in FIGS. 7A, 8A, and 9A, may be similar at least in part to the openings shown in FIG. 6, or may include other embodiments of the openings.

Figure 7B:
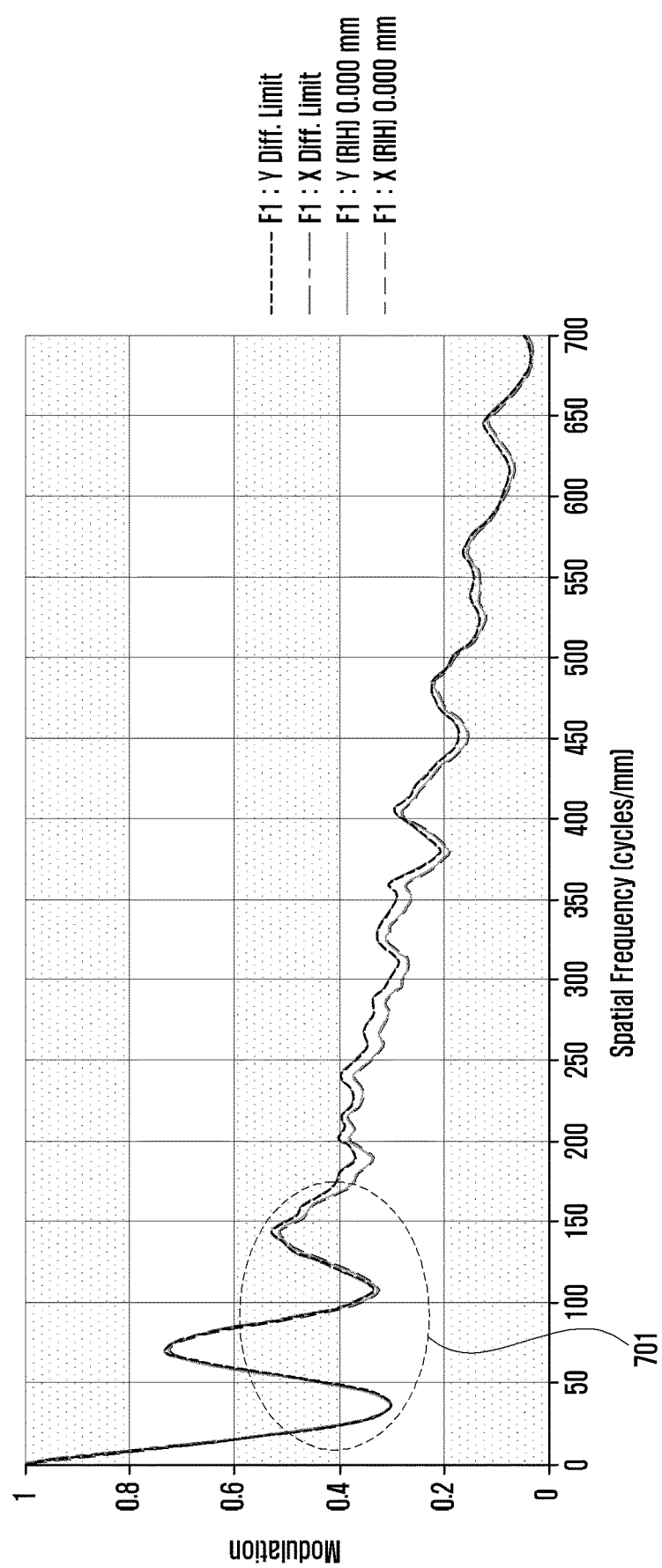

Referring to FIGS. 7A and 7B, the opaque layer 460 may have the plurality of openings 461 disposed at regular intervals. According to an embodiment, the display panel (e.g., the display panel 431 in FIG. 6) may include a plurality of pixels P, disposed at positions overlapped with the non-transmission portion where the plurality of openings 461 are avoided, and a plurality of wirings B electrically connecting the plurality of pixels P. In another embodiment, the plurality of pixels P and the plurality of wirings B may be disposed to be overlapped at least partially with the plurality of openings 461. According to an embodiment, each of the openings 461 may be formed to have at least in part a straight side. In this case, each opening 461 may have at least one internal angle between adjacent sides. According to an embodiment, at least one of such internal angles may be 90 degrees or more.

According to various embodiments, the size (e.g., area) of each opening 461 may be determined to have a range of about 1/10 to 1/2 of the size of the unit pixel P. According to an embodiment, an interval or distance (d) between adjacent openings 461 may be determined to have a range of about 1/10 to 1/2 of the size of the unit pixel P.

According to various embodiments, each opening 461 may be formed in a regular octagonal shape. According to an embodiment, the plurality of openings 461 each having a regular octagonal shape may be formed to have a size satisfying the above-described transmittance. In this case, as shown in FIG. 7B, the camera device (e.g., the camera device 500 in FIG. 5A) may obtain an MTF curve consistent with a limit diffraction curve of the lens through the transmission area having a transmittance caused by the plurality of openings 461. This means that a camera performance of about 0.3 or more is exhibited in contrast in a low frequency band as indicated by reference numeral 701.

Figure 8B:
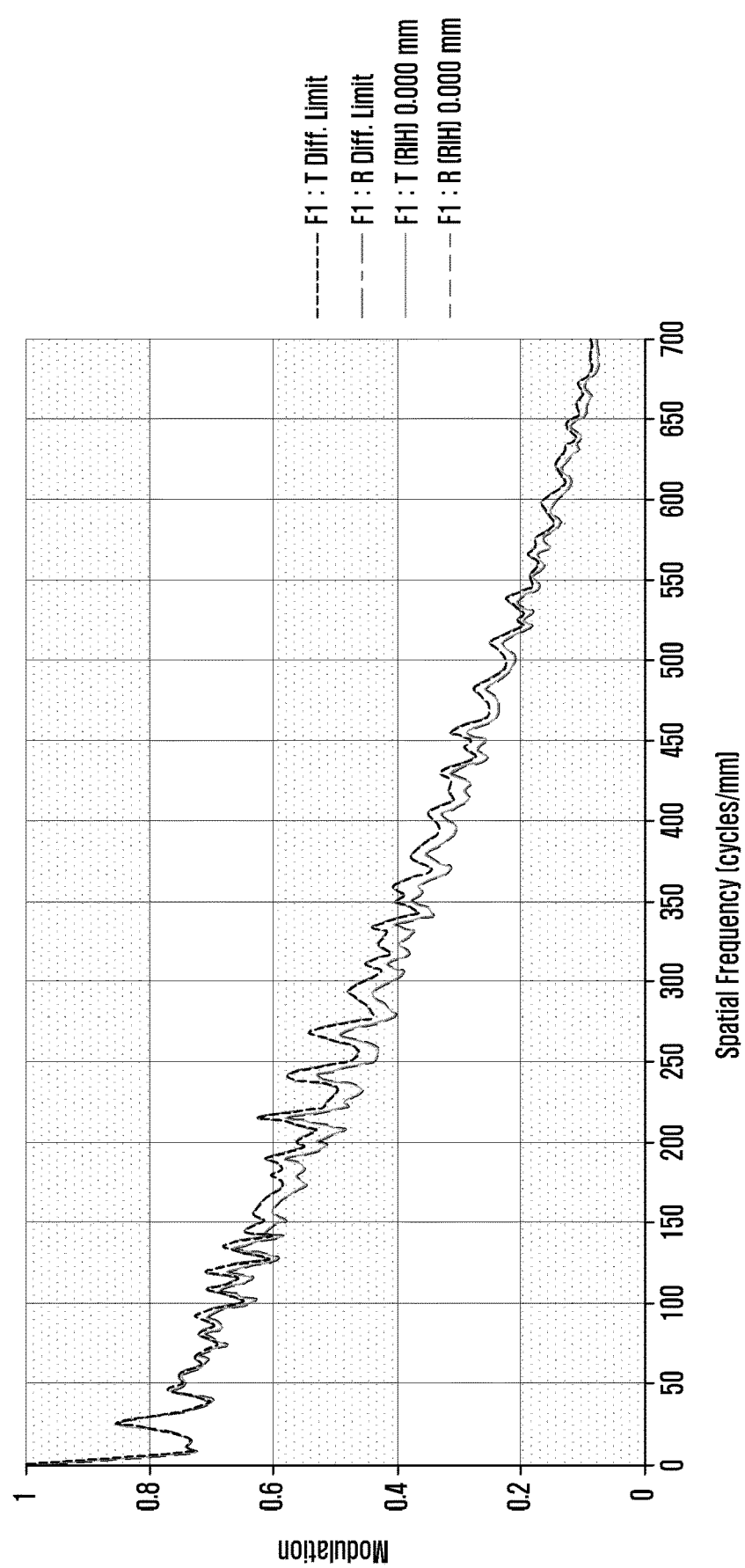

Referring to FIGS. 8A and 8B, an opaque layer 810 may have a plurality of openings 811 arranged at regular intervals. According to an embodiment, each of the plurality of openings 811 may be formed in a square shape. According to an embodiment, the plurality of openings 811 each formed in a square shape may cause the transmission area to have a higher transmittance than in case of FIG. 7A. In this case, as shown in FIG. 8B, the camera device (e.g., the camera device 500 in FIG. 5A) may obtain an MTF curve consistent with a limit diffraction curve of the lens through the transmission area having a transmittance caused by the plurality of openings 811. This means that an image having a better resolution can be obtained through a curve expressed more linearly than in case of FIG. 7B in a low frequency band.

Figure 9B:
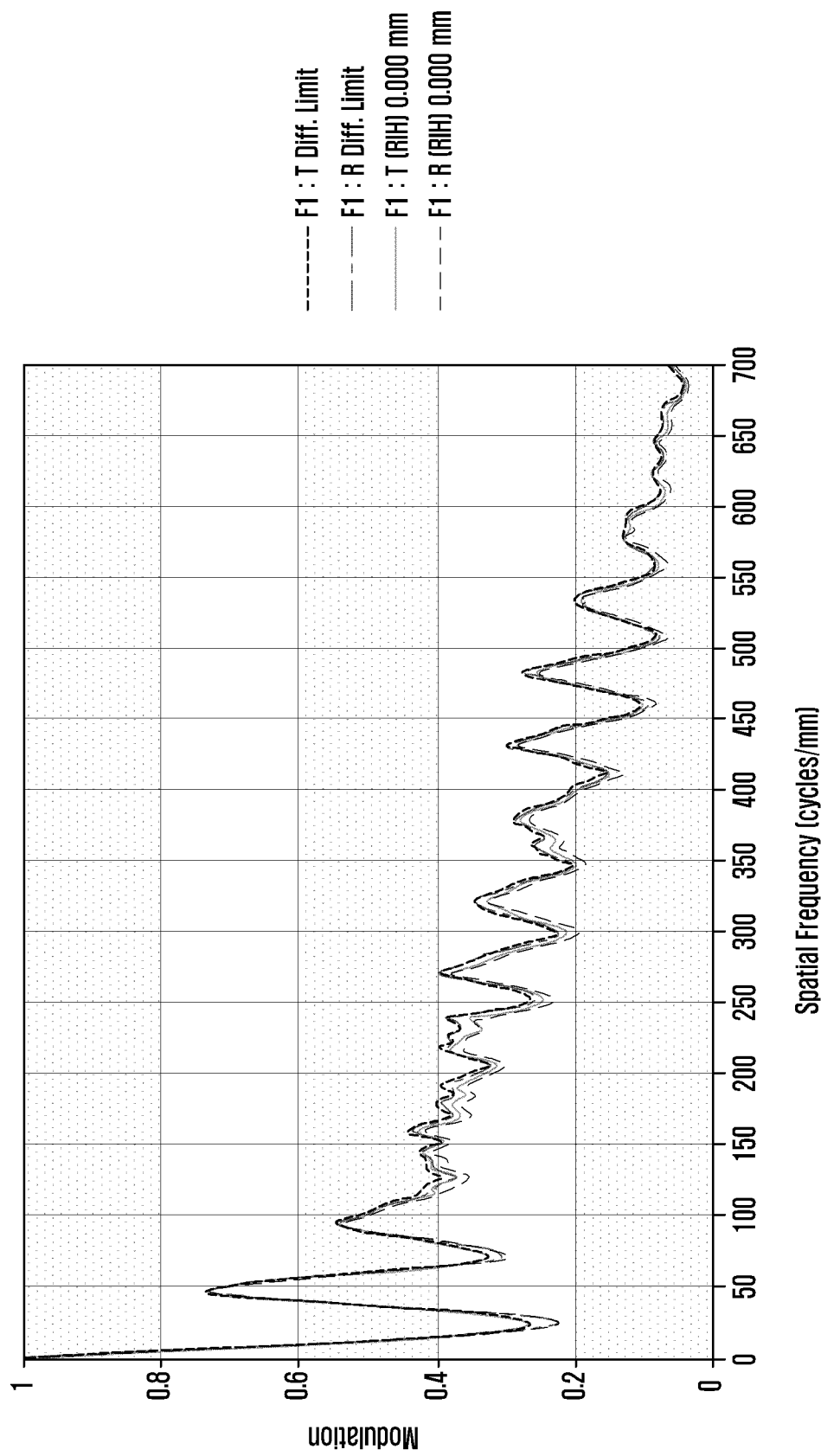

Referring to FIGS. 9A and 9B, an opaque layer 910 may have a plurality of openings 911 arranged at regular intervals. According to an embodiment, each of the plurality of openings 911 may be formed in a regular pentagon shape. In this case, as shown in FIG. 9B, the camera device (e.g., the camera device 500 in FIG. 5A) may obtain an MTF curve generally consistent with a limit diffraction curve of the lens through the transmission area having a transmittance caused by the plurality of openings 911. This means that a desirable camera performance is exhibited in a low frequency band.

According to various embodiments, high diffraction may occur due to the plurality of openings in the transmission area of the display panel. For example, the width(s) of the opening in the x-axis and/or y-axis direction(s) may affect a diffraction angle, thereby causing diffracted energy to be collected or spread. In addition, an interval between the openings may generate a second peak due to destructive interference between diffracted light sources, thereby causing a gap of a diffraction pattern to be narrowed or widened. In addition, a shape of the opening may affect a shape of a diffraction pattern by changing a diffraction angle. When the diffracted light reaches the image sensor through the lens of the camera device, it may deteriorate the quality of an image as noise. Depending on the shape of the opening, concentrated diffracted light may form a shape such as a cross, may cause a double image that a two- or three-fold image appears around an image shape, or may cause an image to appear blurry.

According to various embodiments, appropriately adjusting the shape, size, arrangement density, and/or arrangement interval of the plurality of openings can reduce the degree of diffraction in the transmission area of the display panel while maintaining the MTF performance of the camera device.

FIGS. 10A to 12B are diagrams illustrating various opening shapes with different arrangement densities and corresponding simulation images showing different degrees of diffraction of light according to various embodiments of the disclosure.

Figure 10A:
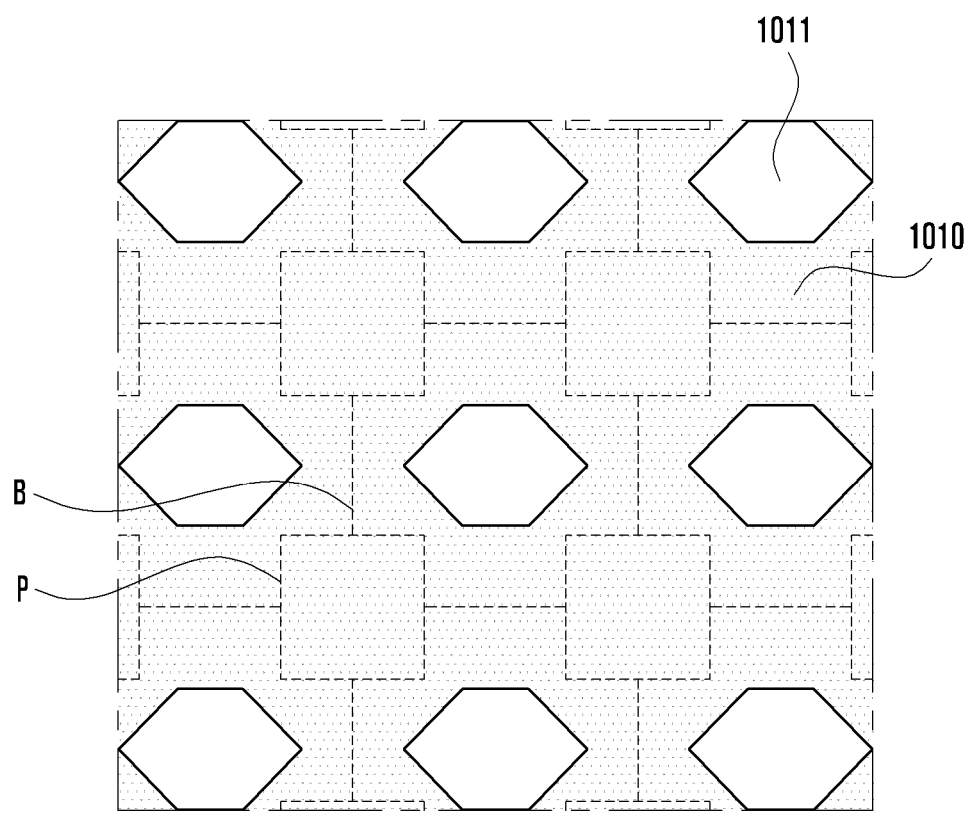
FIGS. 10A 10B, 11A, 11B, 12A and 12B are diagrams illustrating various opening shapes with different arrangement densities and corresponding simulation images showing different degrees of diffraction of light according to various embodiments of the disclosure.

Referring to FIG. 10A, an opaque layer 1010 may have a plurality of openings 1011 arranged at regular intervals. According to an embodiment, each of the plurality of openings 1011 may be formed in a hexagonal shape.

Figure 11A:
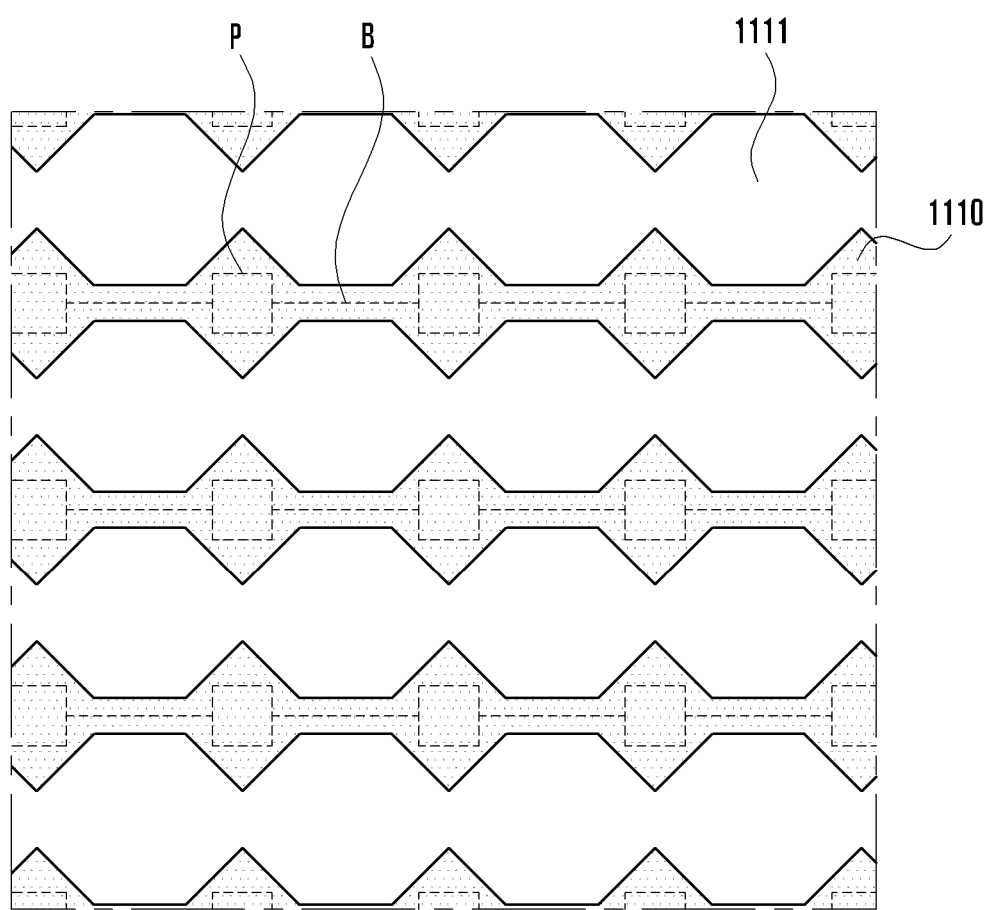

Referring to FIG. 11A, an opaque layer 1110 may have a plurality of hexagonal openings 1111 formed consecutively. According to an embodiment, the arrangement density of the plurality of openings 1111 may be higher than the arrangement density of the plurality of openings 1011 in FIG. 10A.

Figure 10B:
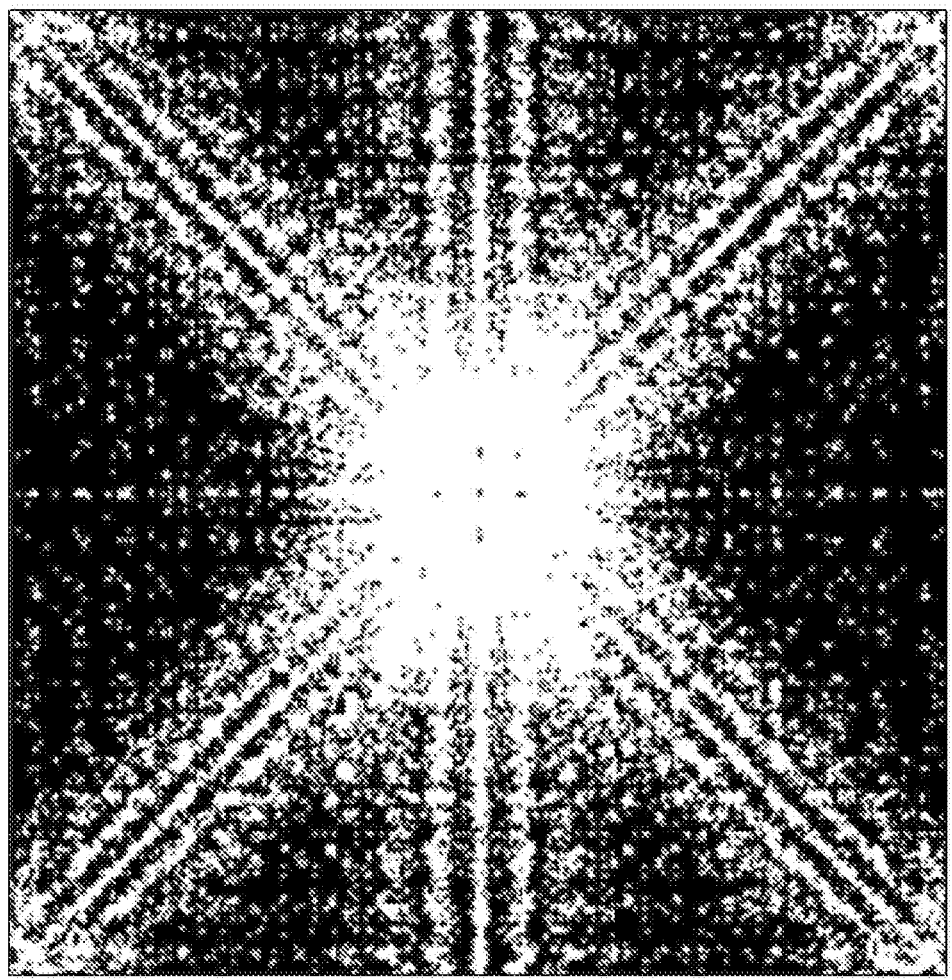
Figure 11B:
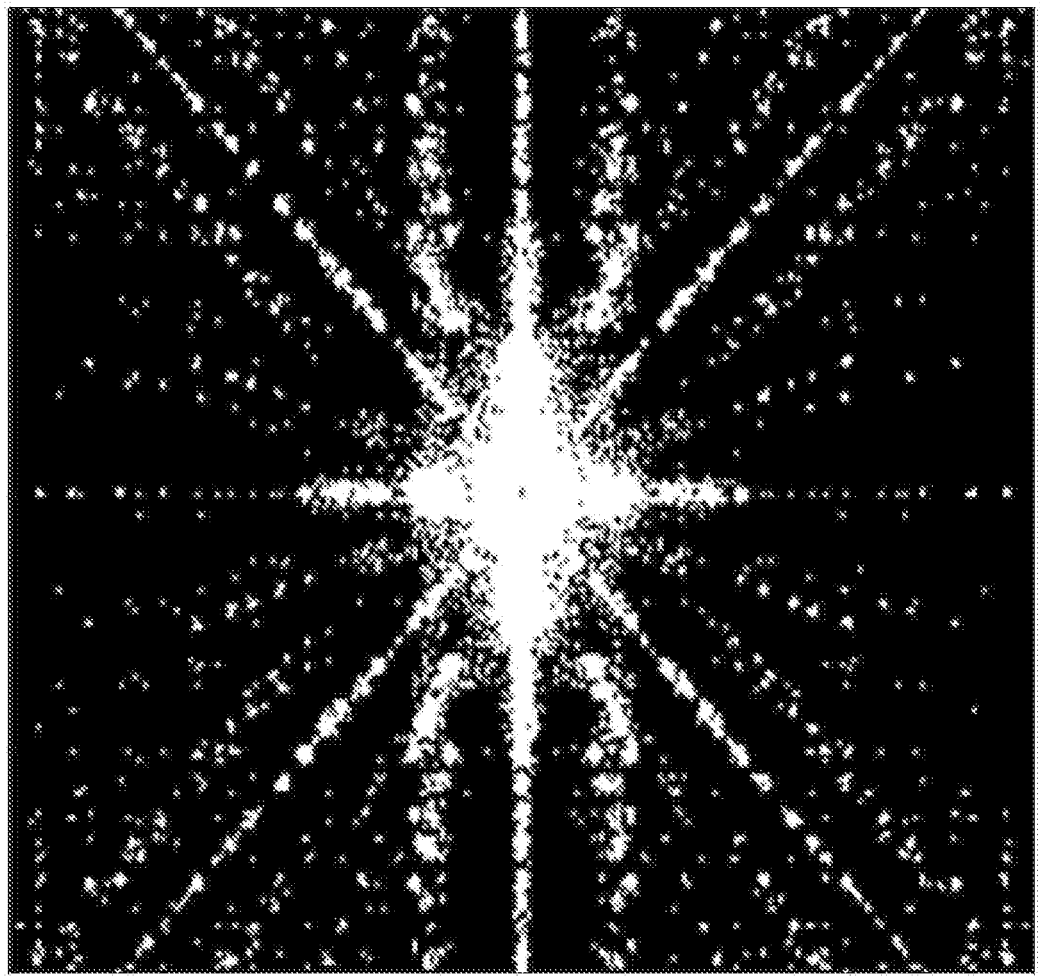

Referring to FIGS. 10B and 11B, the transmission area (e.g., the transmission area A1 in FIG. 6) containing the plurality of openings 1111 in FIG. 11A with a higher arrangement density causes less diffraction of light than the transmission area containing the plurality of openings 1011 in FIG. 10A with a lower arrangement density. This means that the quality of an image captured by the camera device (e.g., the camera device 500 in FIG. 5A) is better in case of FIG. 11A.

Figure 12A:
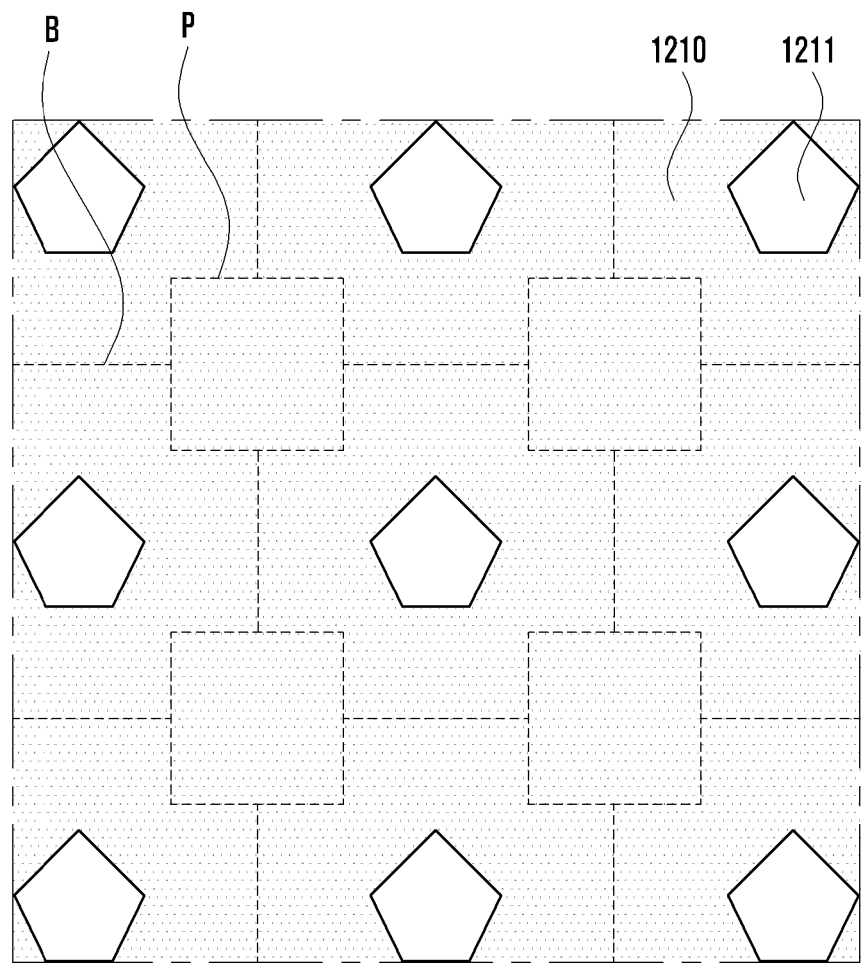

Referring to FIG. 12A, an opaque layer 1210 may have a plurality of openings 1211 arranged at regular intervals. According to an embodiment, the plurality of openings 1211 may be formed in a pentagonal shape and may have a lower arrangement density than in case of FIG. 10A.

Figure 12B:
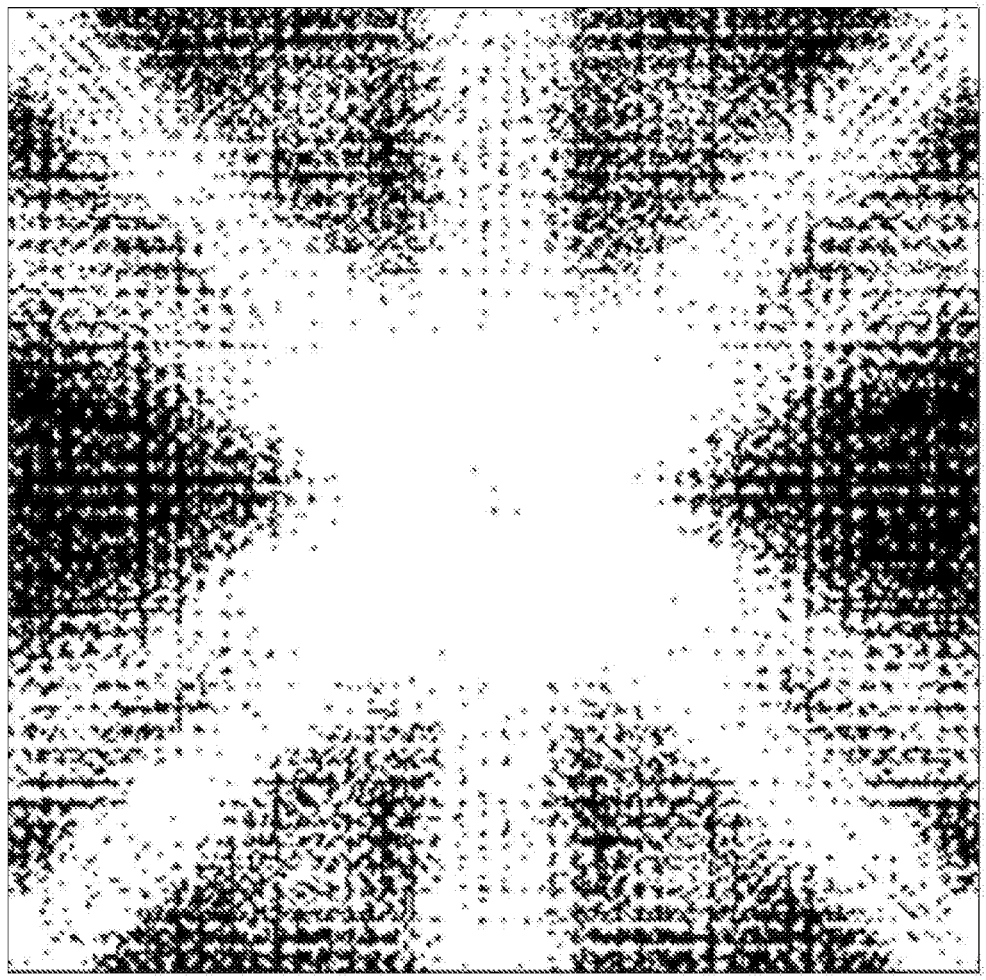

Referring to FIG. 12B, the degree of diffraction of light is greater than in case of FIG. 11B. This means that the quality of an image captured by the camera device (e.g., the camera device 500 in FIG. 5A) is less excellent than in case of FIG. 11A.

Referring to FIGS. 13A to 14B, they are diagrams illustrating openings having different shapes and the same area and corresponding simulation images showing different degrees of diffraction of light according to various embodiments of the disclosure.

Figure 13A:
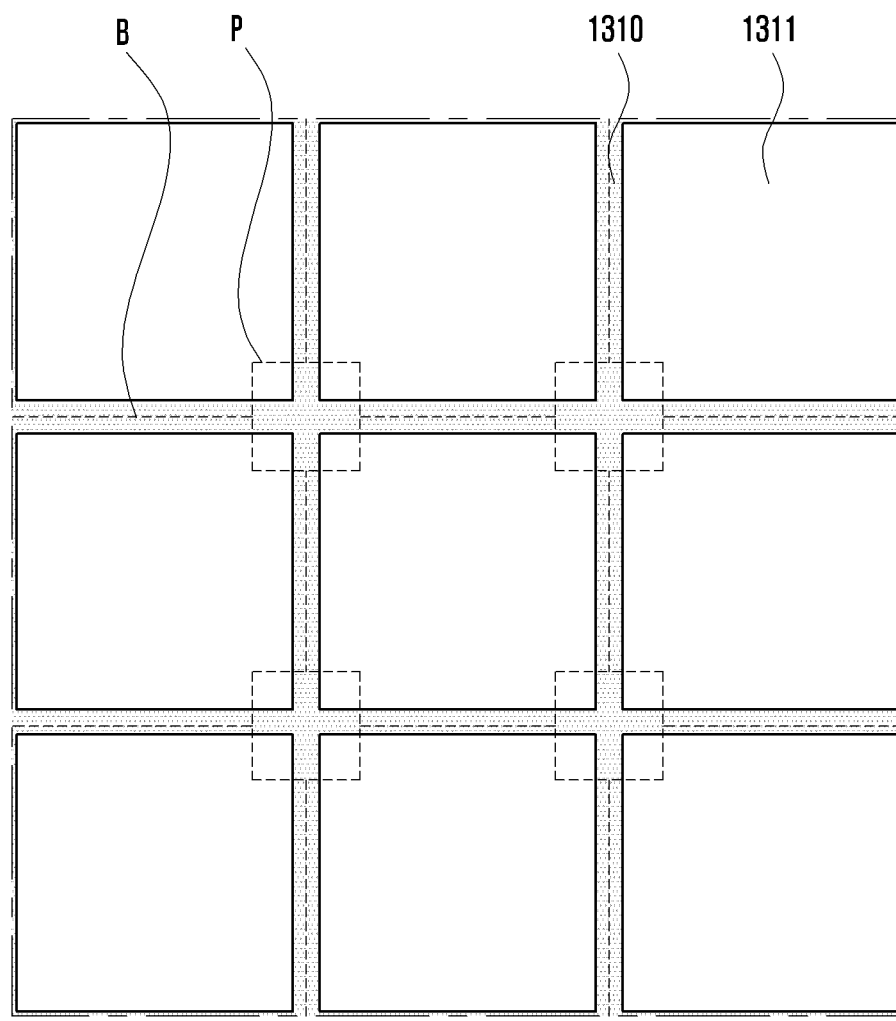
FIGS. 13A, 13B, 14A and 14B are diagrams illustrating openings having different shapes and the same area and corresponding simulation images showing different degrees of diffraction of light according to various embodiments of the disclosure.

Referring to FIG. 13A, an opaque layer 1310 may have a plurality of openings 1311 arranged at regular intervals. According to an embodiment, each of the plurality of openings 1311 may be formed in a square shape.

Figure 14A:
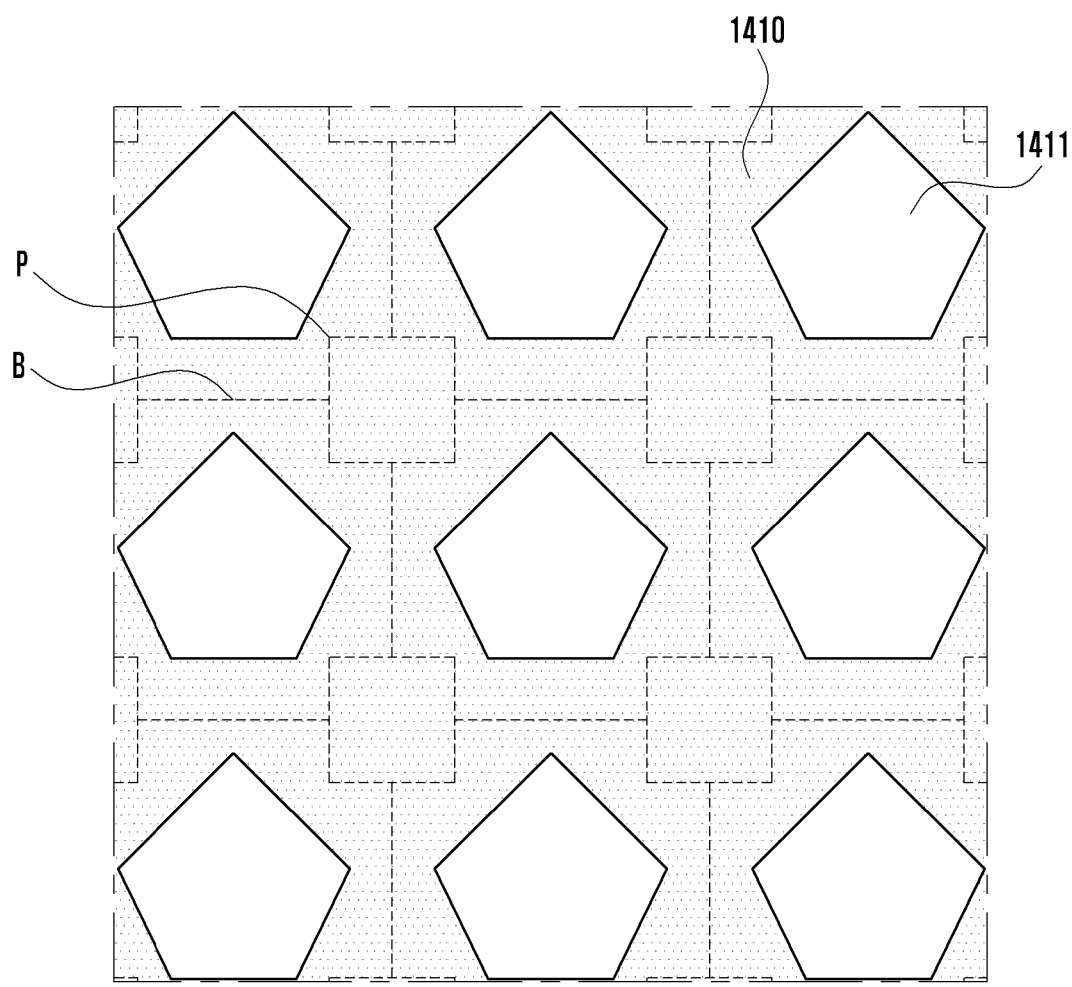

Referring to FIG. 14A, an opaque layer 1410 may have a plurality of hexagonal openings 1411 arranged at regular intervals. The opening 1411 shown in FIG. 14A and the opening 1311 shown in FIG. 13A are different only in shape while having the same size according to an embodiment of the disclosure.

Figure 13B:
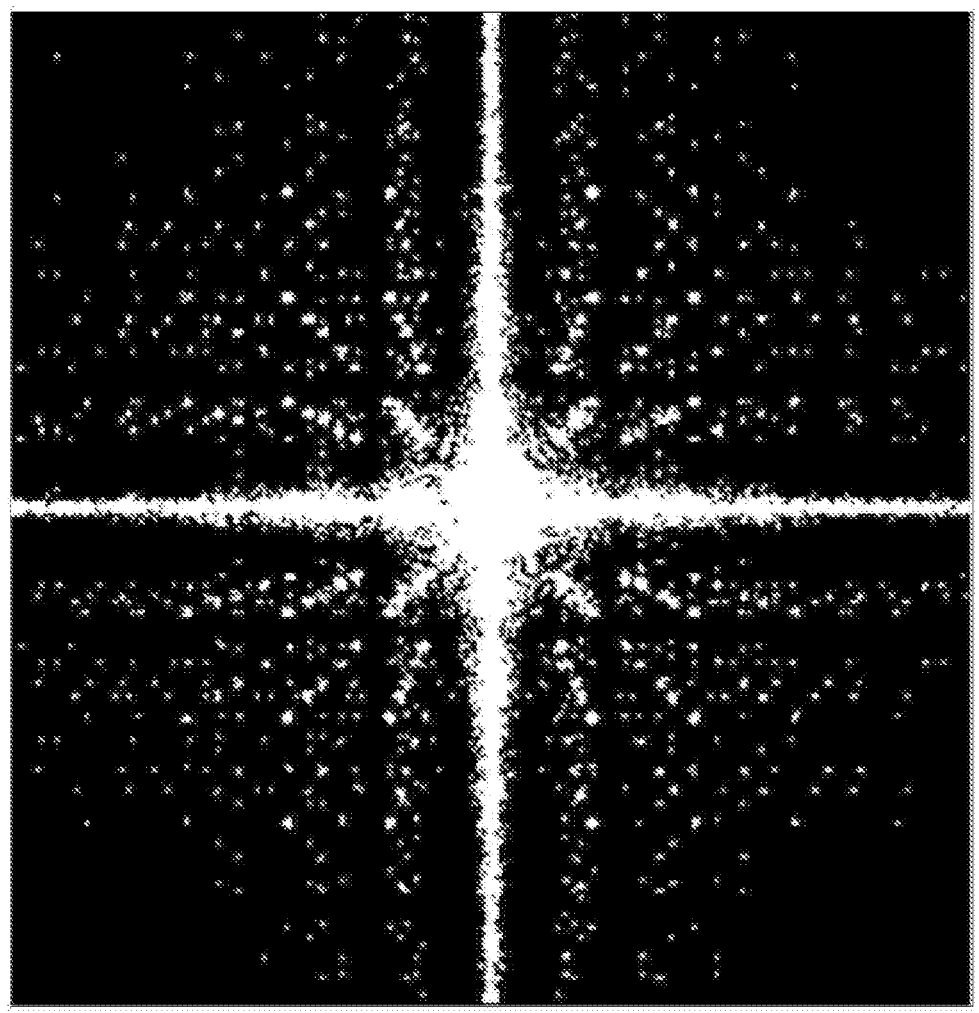
Figure 14B:
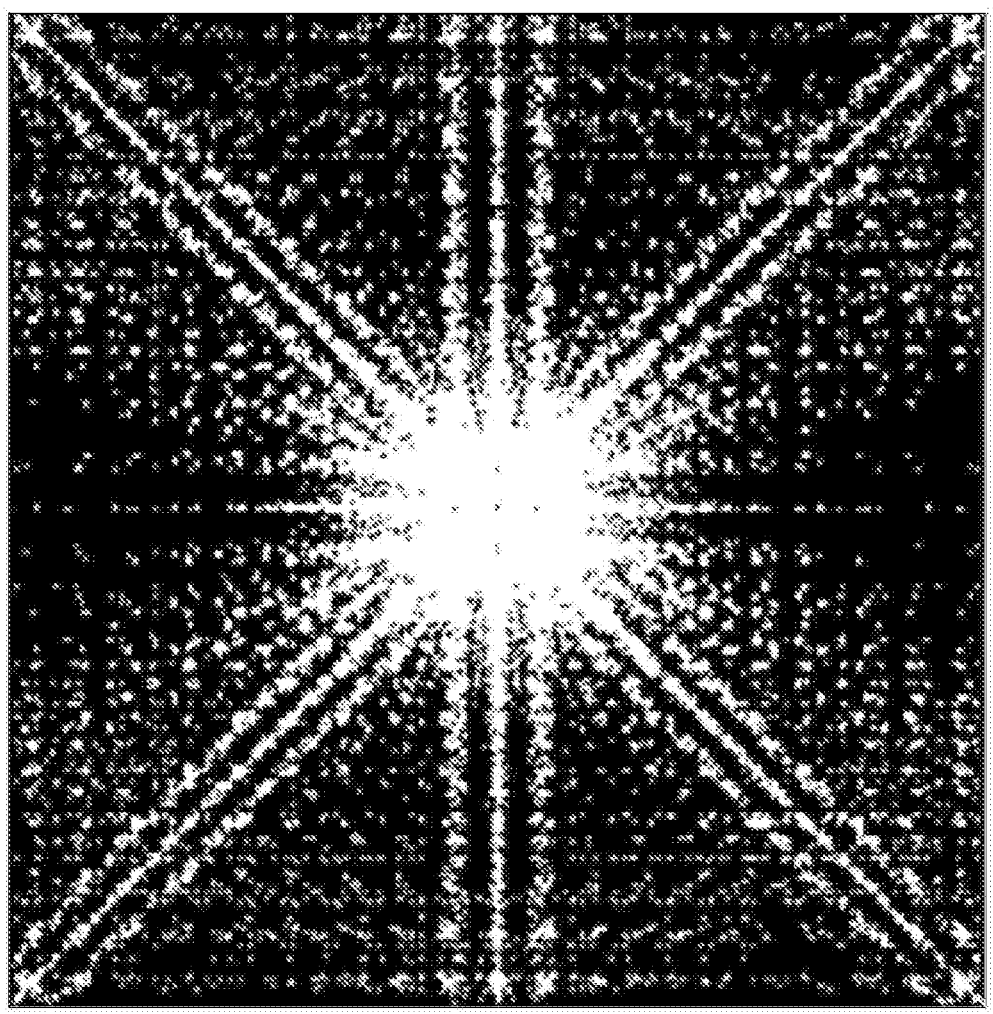

Referring to FIGS. 13B and 14B, it can be seen that even if the openings differ only in shape and have the same size, the degree of diffraction in the transmission area (e.g., the transmission area A1 in FIG. 6) varies depending on the shape of the opening. For example, the transmission area containing the openings 1411 of FIG. 14A with a favorable shape for light scattering has a smaller degree of diffraction of light compared to the transmission area containing the openings 1311 of FIG. 13A with a relatively unfavorable shape for light scattering. This means that the quality of an image captured by the camera device (e.g., the camera device 500 in FIG. 5A) is better in case of FIG. 14A.

Referring to FIGS. 15A to 20C, they are diagrams illustrating various opening shapes with or without protrusions, corresponding simulation images showing degrees of diffraction of light, and corresponding MTF graphs according to various embodiments of the disclosure.

According to various embodiments, the openings arranged in the transmission area need to be formed in various shapes having a straight side in order to prevent MTF performance degradation, but such a straight side may cause a problem in that a specific pattern is visually recognized and the degree of diffraction of light increases. According to embodiments, various opening shapes capable of reducing the degree of diffraction of light while maintaining MTF performance can be implemented.

Figure 15A:
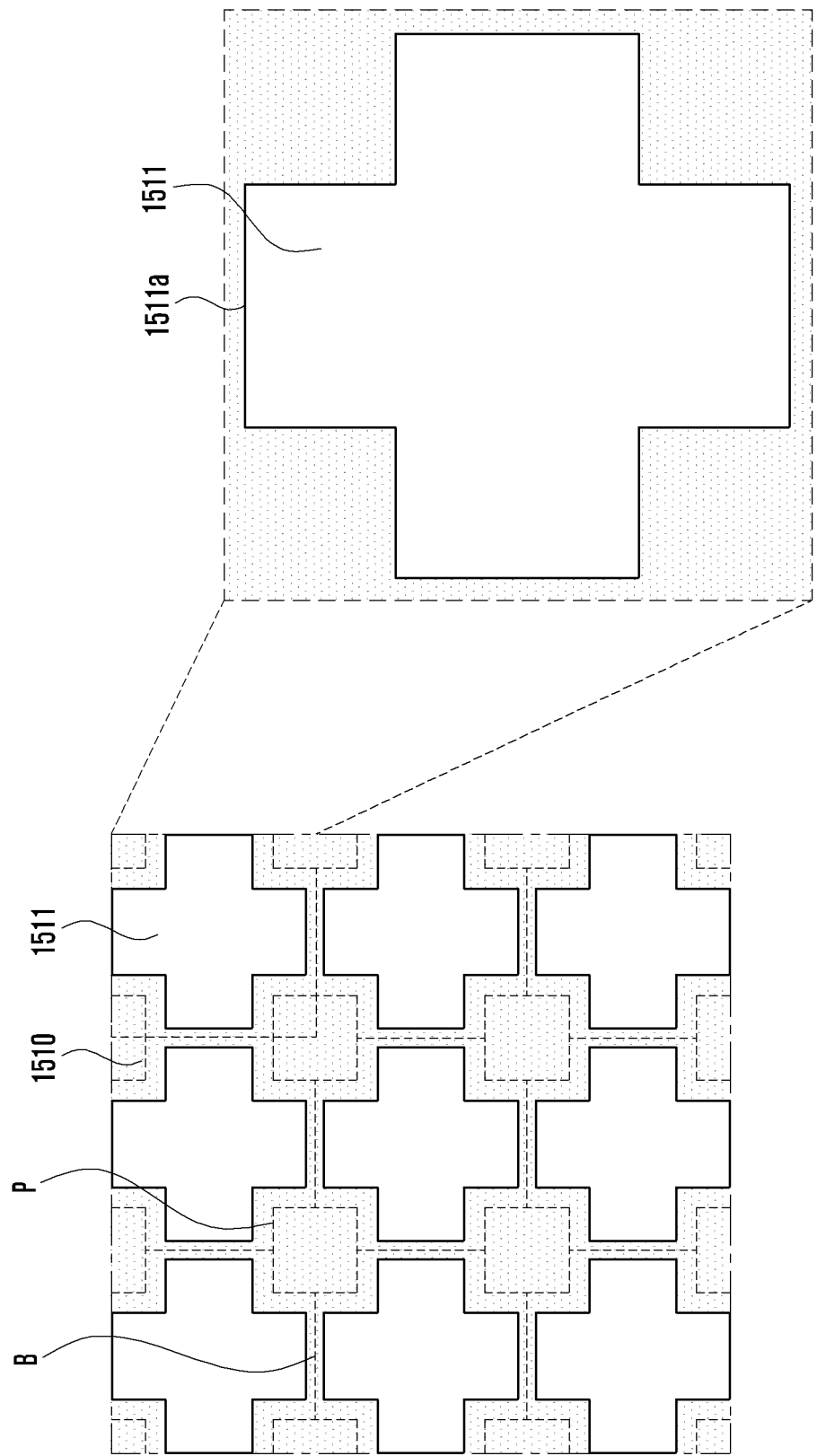
FIGS. 15A, 15B, 15C, 16A, 16B, 16C, 17A, 17B, 17C, 18A, 18B, 18C, 18D, 19A, 19B, 19C, 20A, 20B and 20C are diagrams illustrating various opening shapes with or without protrusions, corresponding simulation images showing degrees of diffraction of light, and corresponding MTF graphs according to various embodiments of the disclosure.

Referring to FIG. 15A, an opaque layer 1510 may have a plurality of openings 1511 arranged at regular intervals. According to an embodiment, each of the plurality of openings 1511 may be formed in a cross shape. According to an embodiment, the cross shape of the opening 1511 may be composed of straight sides 1511a.

Figure 16A:
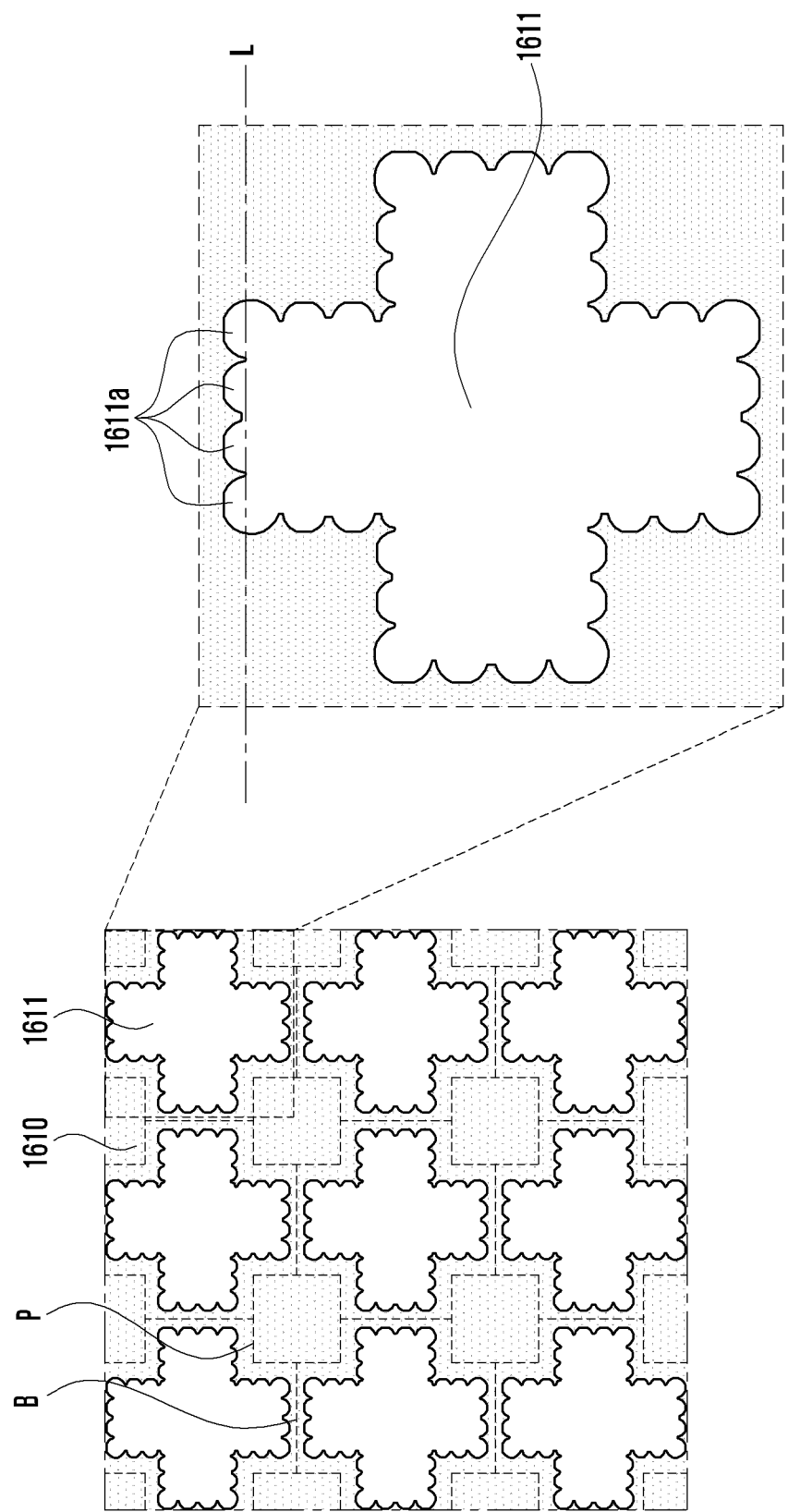

Referring to FIG. 16A, an opaque layer 1610 may have a plurality of openings 1611 arranged at regular intervals. According to an embodiment, each of the openings 1611 may have a substantially cross shape in which each straight side 1511a of the opening 1511 shown in FIG. 15A is replaced by a plurality of protrusions 1611a. According to an embodiment, the plurality of protrusions 1611a may be continuous protrusions protruding outward from an imaginary straight line L of the opening 1611. According to an embodiment, the plurality of protrusions 1611a may be formed to have equal or unequal radius of curvature. According to an embodiment, each of the plurality of protrusions 1611a may be formed to have a radius of curvature of ¹⁄₄₀ or more of a length of one side.

Figure 15B:
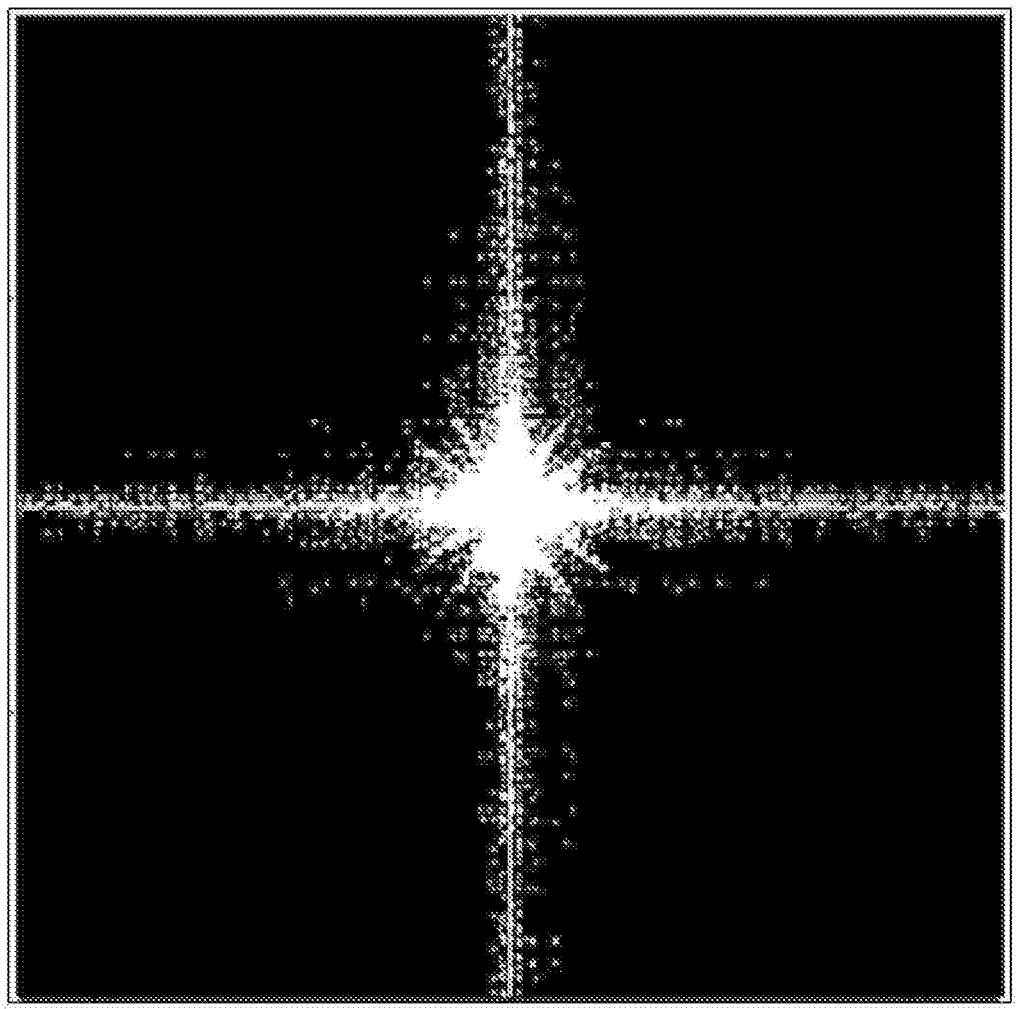
Figure 16B:
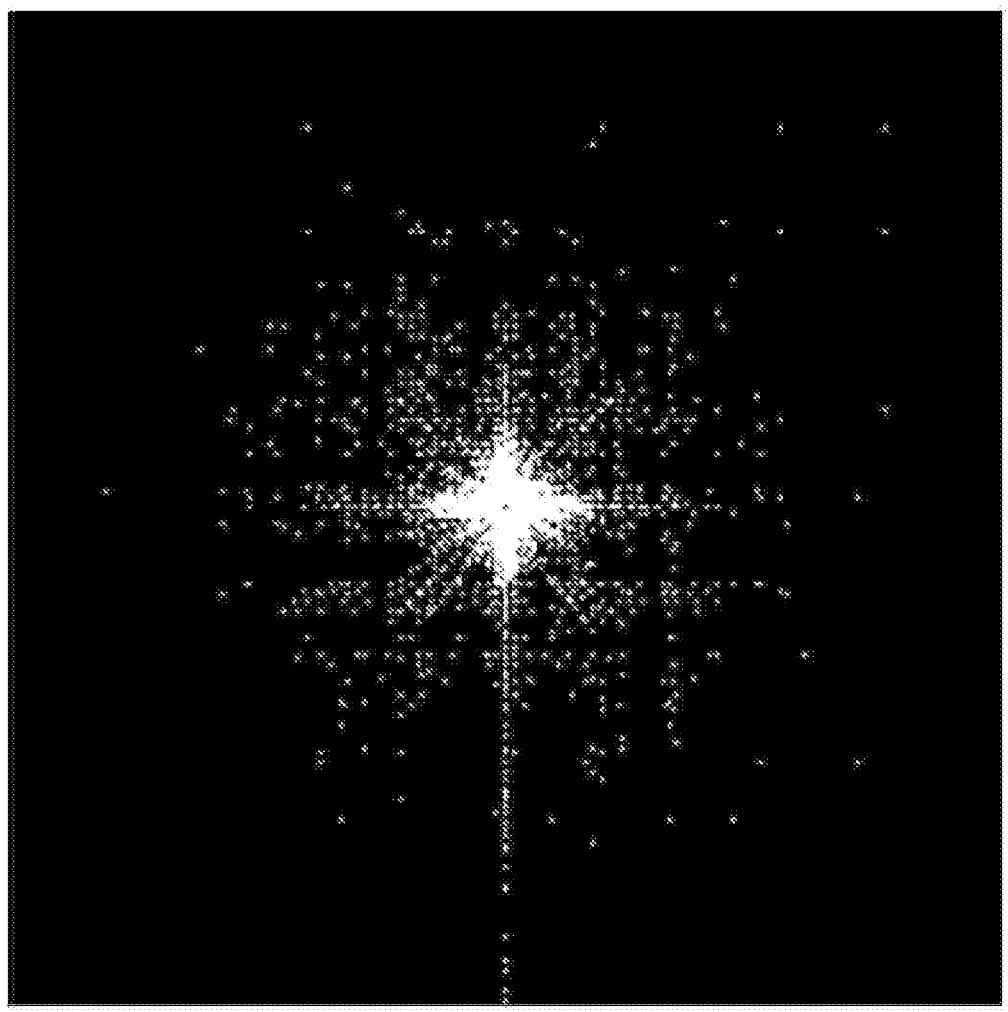

Referring to FIGS. 15B and 16B, it can be seen that the degree of diffraction of light in the transmission area (e.g., the transmission area A1 in FIG. 6) is varied depending on the presence or absence of the plurality of protrusions 1611a. That is, the transmission area containing the openings 1611 of FIG. 16A with a favorable shape for light scattering by the protrusions 1611a has a smaller degree of diffraction of light compared to the transmission area containing the openings 1511 of FIG. 15A with a relatively unfavorable shape for light scattering by having the straight sides 1511a. This means that the quality of an image captured by the camera device (e.g., the camera device 500 in FIG. 5A) is better in case of FIG. 16A.

Figure 15C:
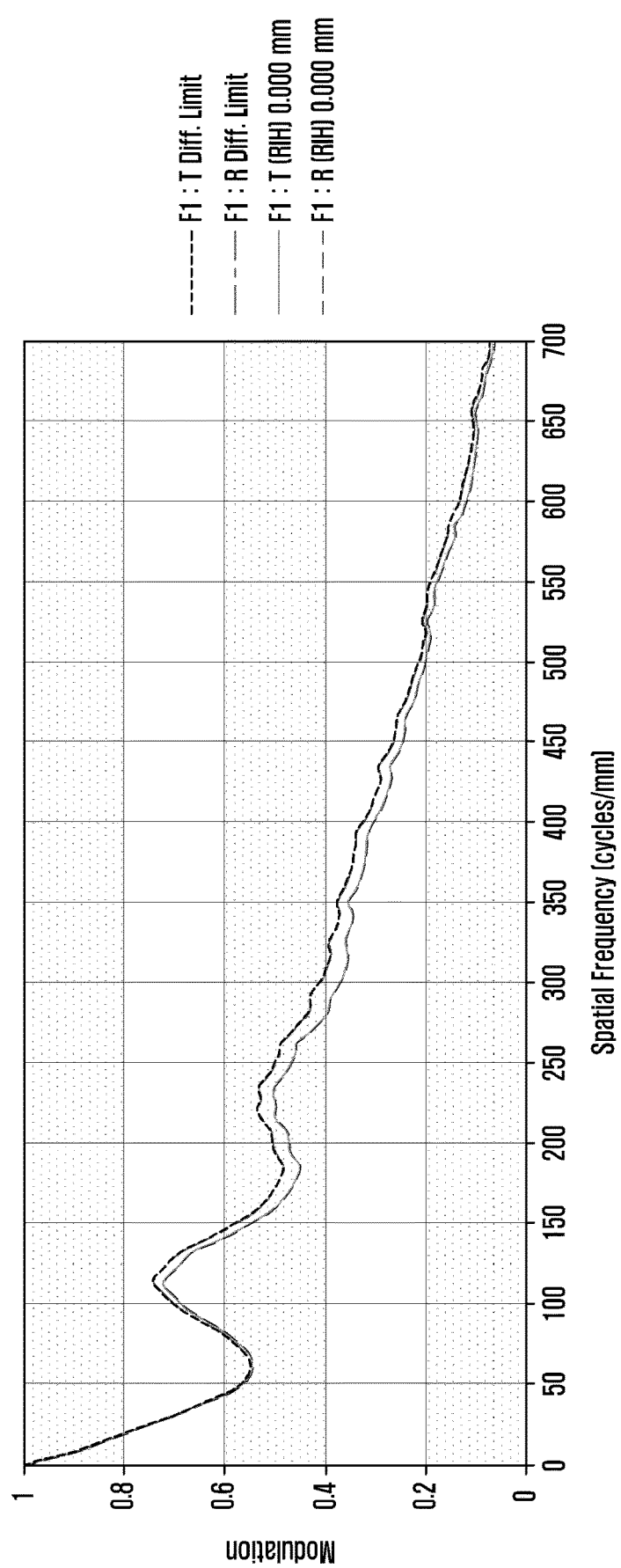
Figure 16C:
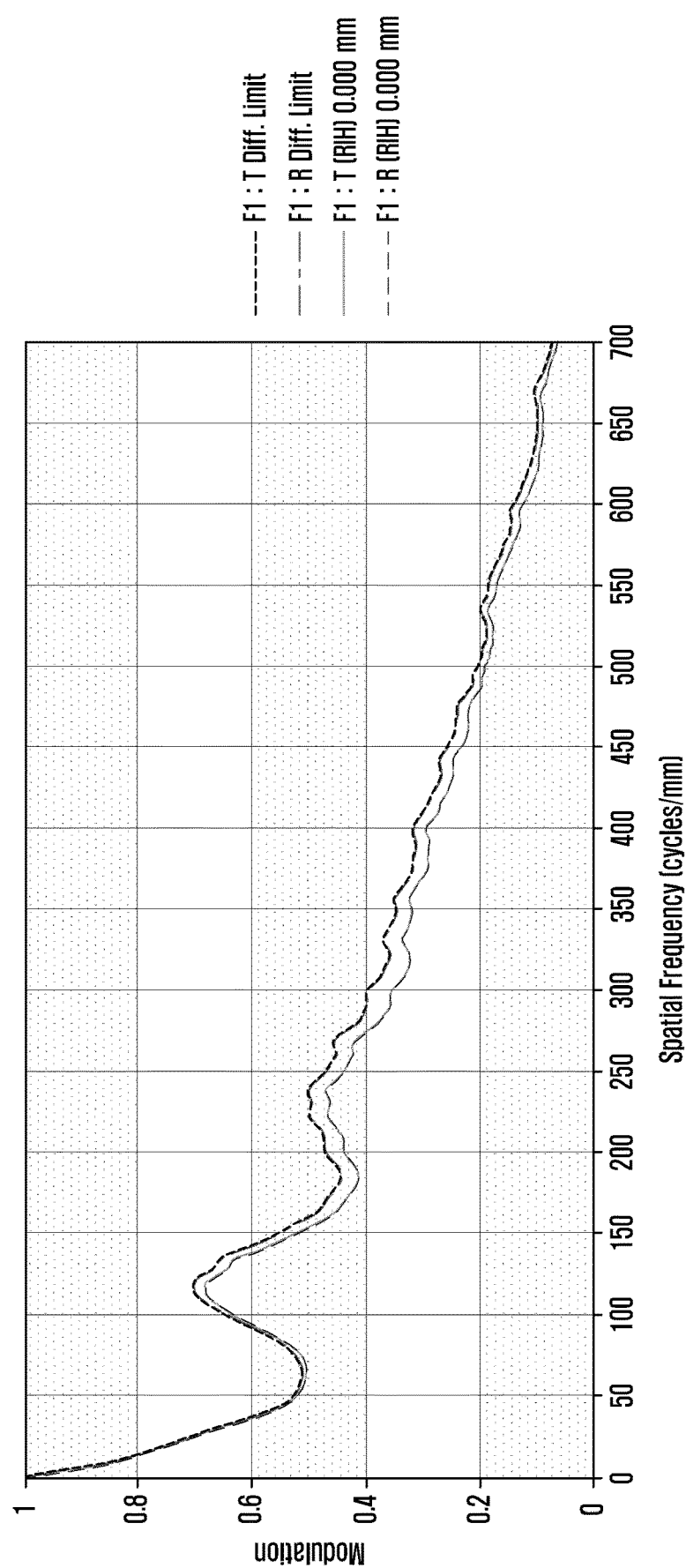

Referring to FIGS. 15C and 16C, it can be seen that the MTF performance of the transmission area by the openings 1511 and 1611 is not varied regardless of the presence or absence of the plurality of protrusions 1611a.

Figure 17A:
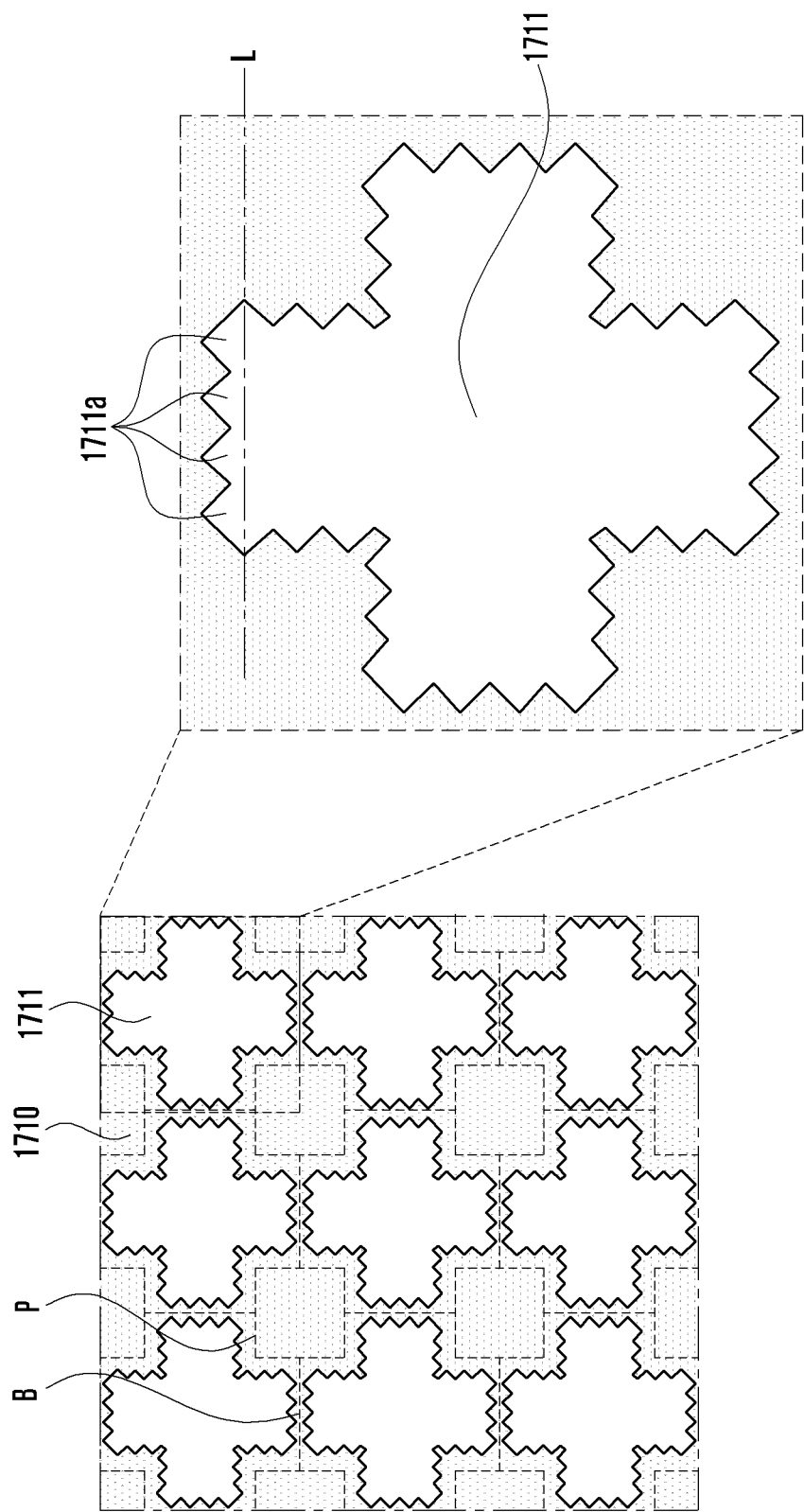

Referring to FIG. 17A, an opaque layer 1710 may have a plurality of openings 1711 arranged at regular intervals. According to an embodiment, each of the openings 1711 may have a substantially cross shape in which each straight side 1511a of the opening 1511 shown in FIG. 15A is replaced by a plurality of protrusions 1711a. According to an embodiment, each protrusion 1711a may be formed to have a shape consisting of two small sides of a triangle. In this case, each small side of the triangle may have a length of about ¹⁄₂₀ or more of the length of one side of the opening 1711, and an internal angle between the two small sides of the triangle may be formed to be about 10 degrees or more. In another embodiment, each protrusion 1711a may be formed in any polygonal shape such as a square or a pentagon other than a triangle.

Figure 17B:
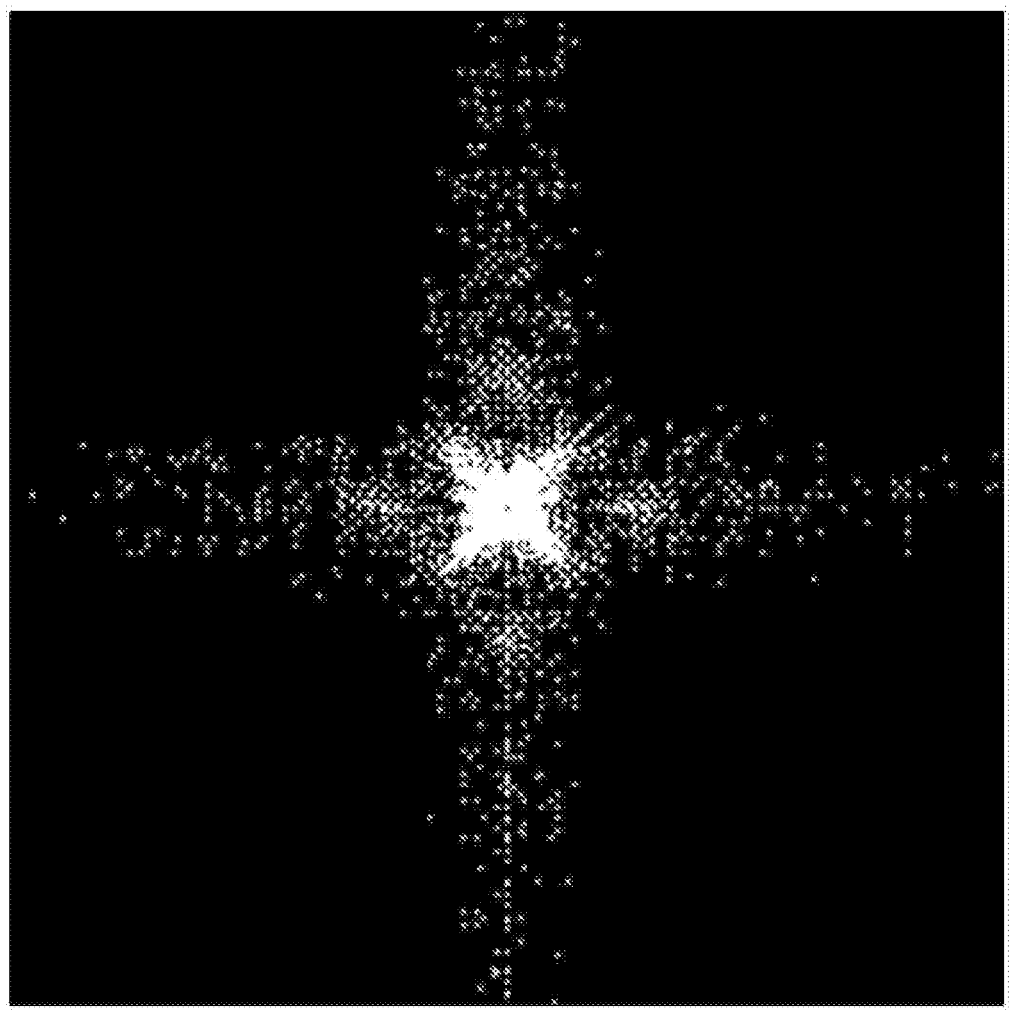

Referring to FIGS. 15B and 17B, it can be seen that the degree of diffraction of light in the transmission area (e.g., the transmission area A1 in FIG. 6) is varied depending on the presence or absence of the plurality of protrusions 1711a. That is, the transmission area containing the openings 1711 of FIG. 17A with a favorable shape for light scattering by the protrusions 1711a has a smaller degree of diffraction of light compared to the transmission area containing the openings 1511 of FIG. 15A with a relatively unfavorable shape for light scattering by having the straight sides 1511a. This means that the quality of an image captured by the camera device (e.g., the camera device 500 in FIG. 5A) is better in case of FIG. 17A.

Figure 17C:
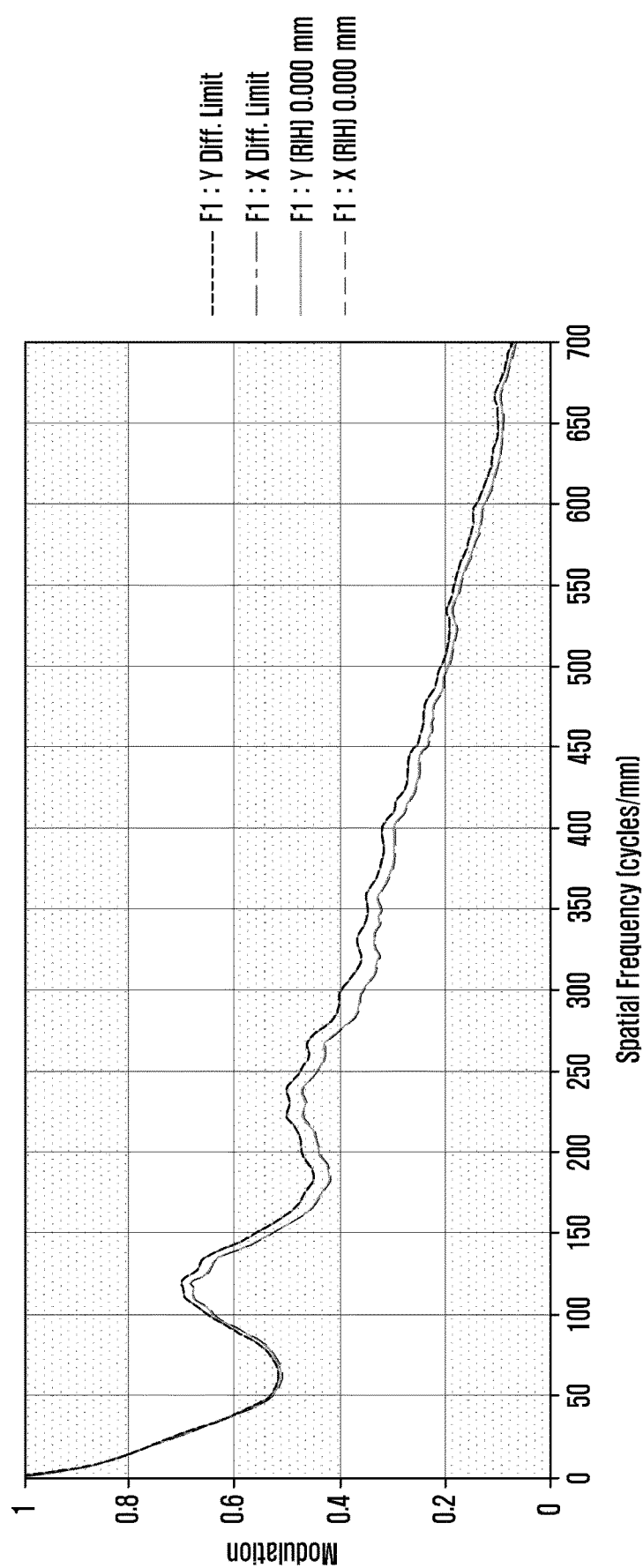

Referring to FIGS. 15C and 17C, it can be seen that the MTF performance of the transmission area by the openings 1511 and 1711 is not varied regardless of the presence or absence of the plurality of protrusions 1711a.

Figure 18A:
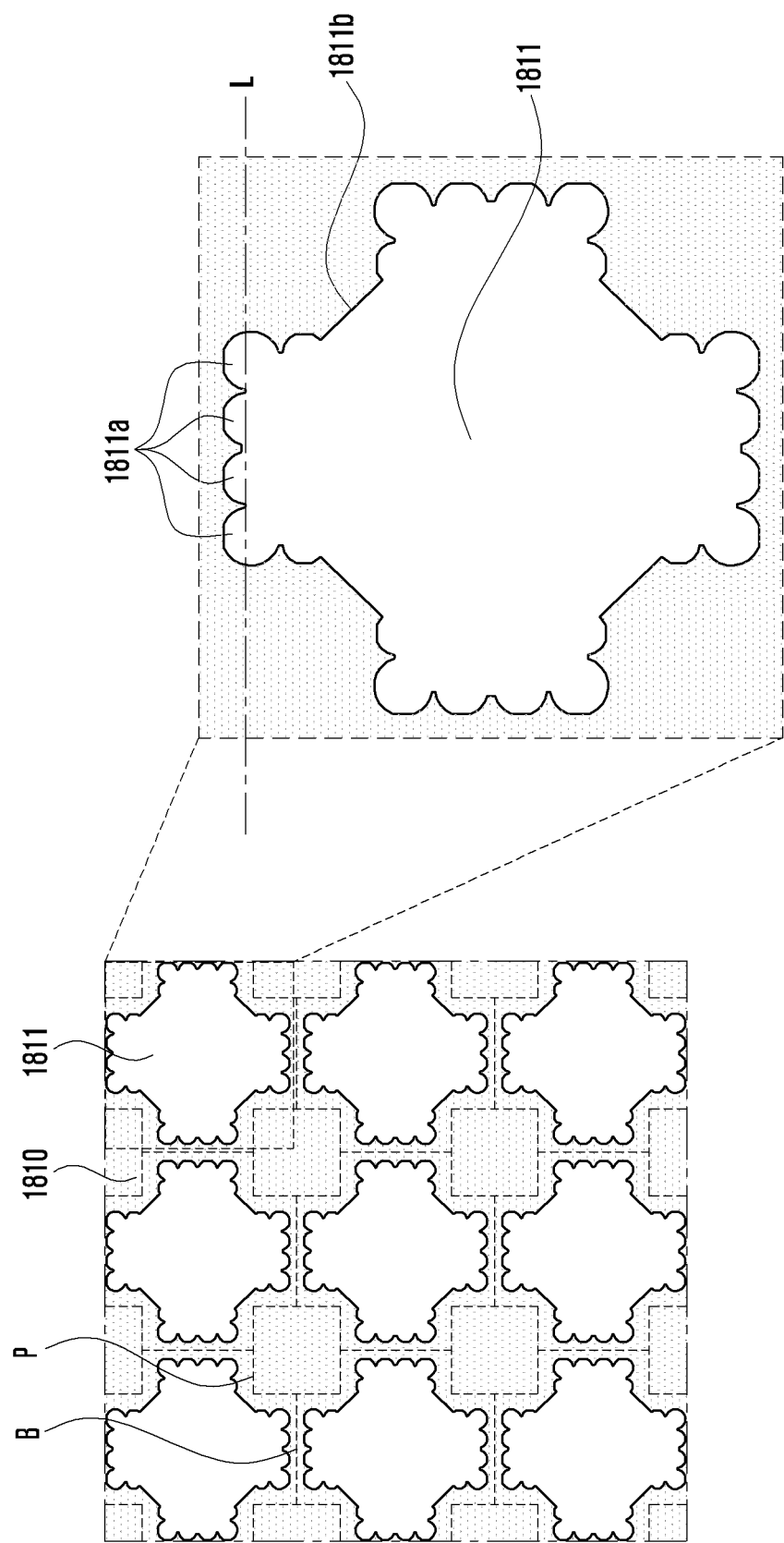

Referring to FIG. 18A, an opaque layer 1810 may have a plurality of openings 1811 arranged at regular intervals. According to an embodiment, each of the openings 1811 may have a substantially cross shape in which the protrusions 1611a of the opening 1611 shown in FIG. 16A are replaced by a plurality of curved protrusions 1811a and straight sides 1811b connecting at least in part the curved protrusions 1811a. According to an embodiment, all edges of each opening 1811 may be formed mostly of the curved protrusions 1811*a* and formed partially of the straight sides 1811*b*. According to an embodiment, the straight sides 1811*b* may help to prevent MTF performance degradation.

Figure 18B:
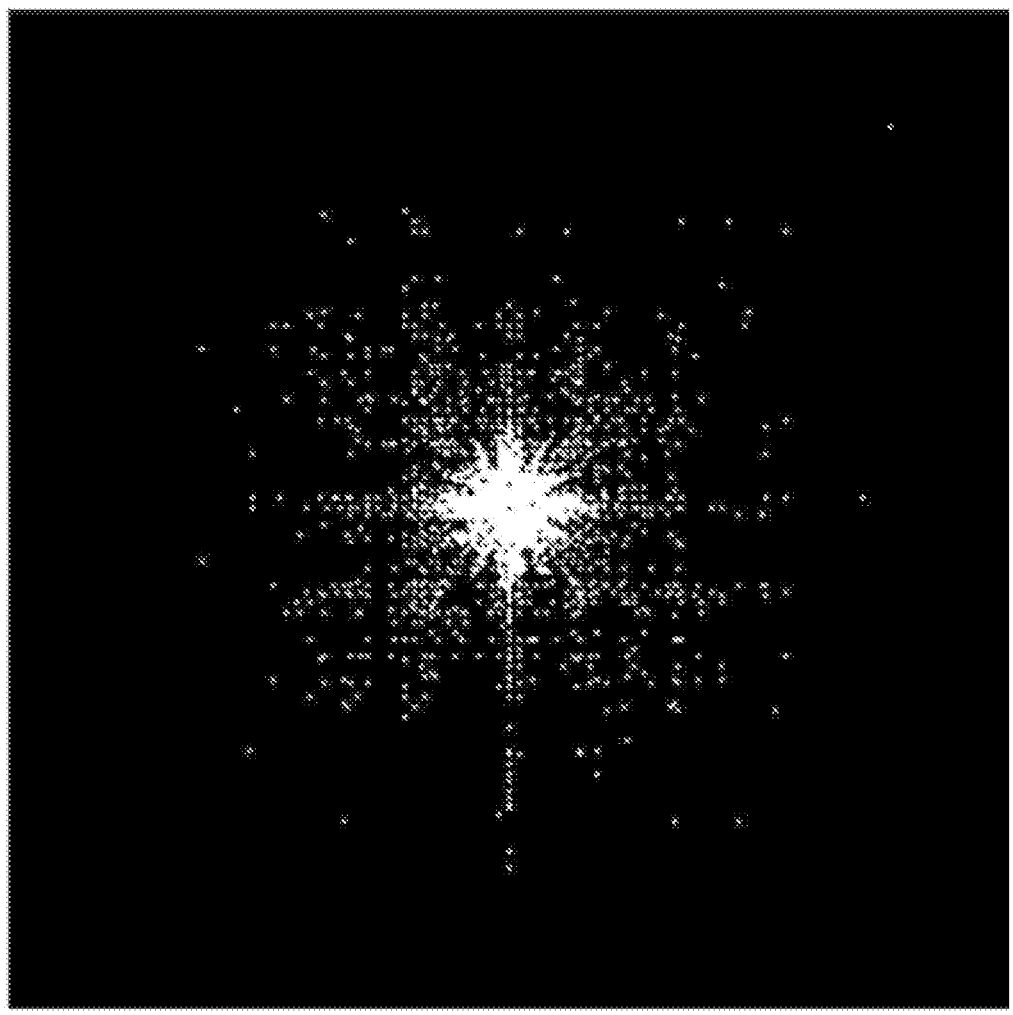

Referring to FIGS. 15B and 18B, it can be seen that the degree of diffraction of light in the transmission area (e.g., the transmission area A1 in FIG. 6) is varied depending on the presence or absence of the plurality of protrusions 1811*a*. That is, the transmission area containing the openings 1811 of FIG. 18A with a favorable shape for light scattering by the curved protrusions 1811*a* and the straight sides 1811*b* has a smaller degree of diffraction of light compared to the transmission area containing the openings 1511 of FIG. 15A with a relatively unfavorable shape for light scattering by having the straight sides 1511*a*. This means that the quality of an image captured by the camera device (e.g., the camera device 500 in FIG. 5A) is better in case of FIG. 18A.

Figure 18C:
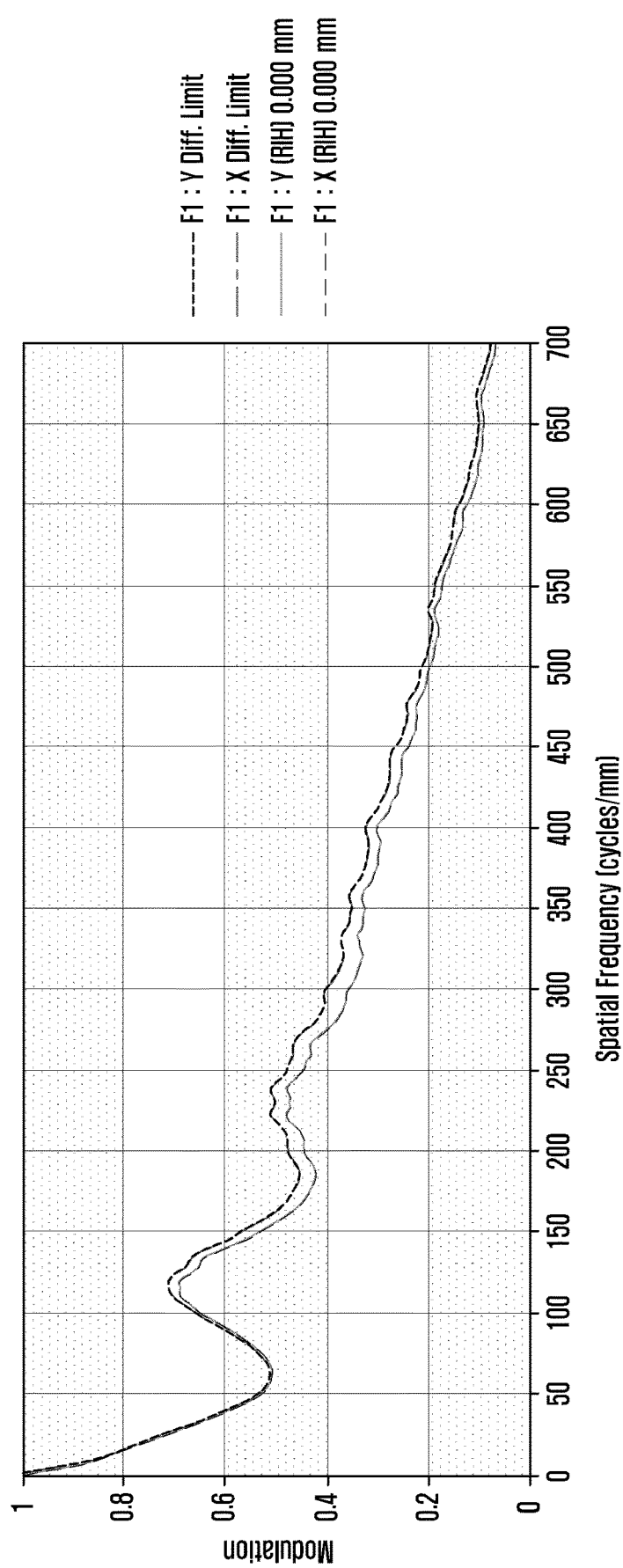

Referring to FIGS. 15C and 18C, it can be seen that the MTF performance of the transmission area by the openings 1511 and 1811 is not varied regardless of the presence or absence of the plurality of protrusions 1811*a*.

Figure 18D:
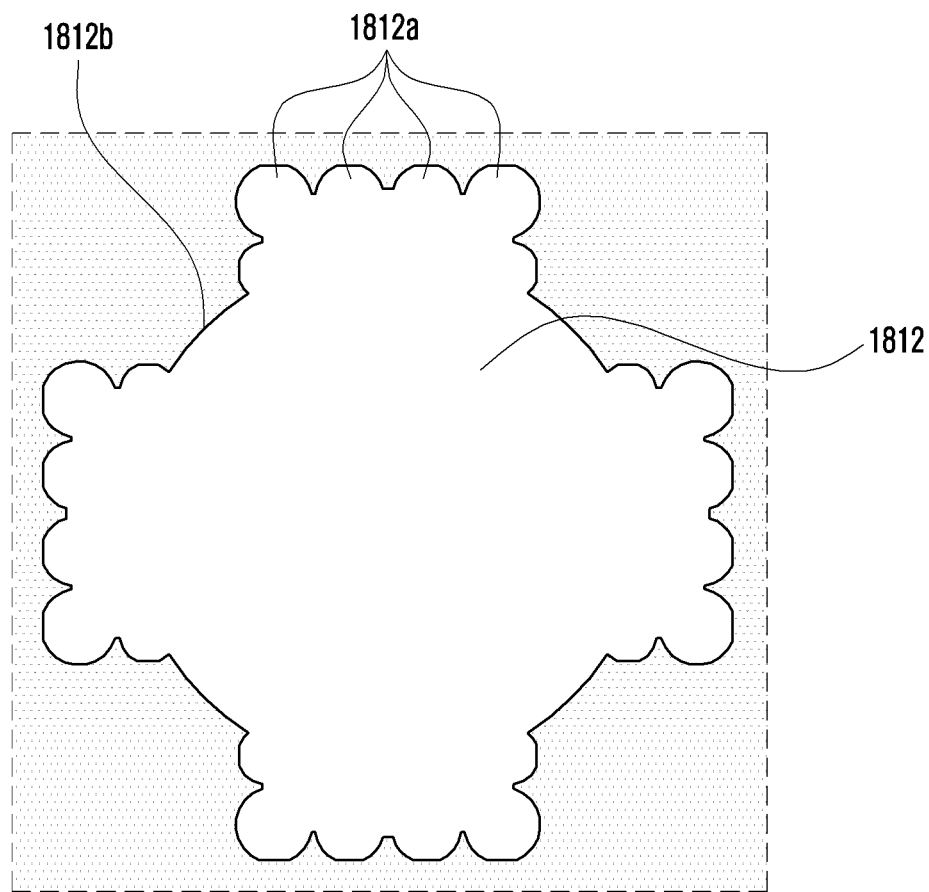

Referring to FIG. 18D, the opaque layer 1810 may have a plurality of openings 1812 arranged at regular intervals. According to an embodiment, each of the openings 1812 may have a substantially cross shape in which a plurality of curved protrusions 1812*a* and gently curved sides 1812*b* are formed. That is, the straight sides 1811*b* of the opening 1811 shown in FIG. 18A are modified to the gently curved sides 1812*b*. The gently curved side 1812*b* has a greater radius of curvature than the curved protrusion 1812*a*. According to an embodiment, because edges of the opening 1812 are mostly composed of the plurality of protrusions 1812*a* having curved shapes, the openings 1812 shown in FIG. 18D can exhibit the performance similar to that of the openings 1811 shown in FIG. 18A.

Figure 19A:
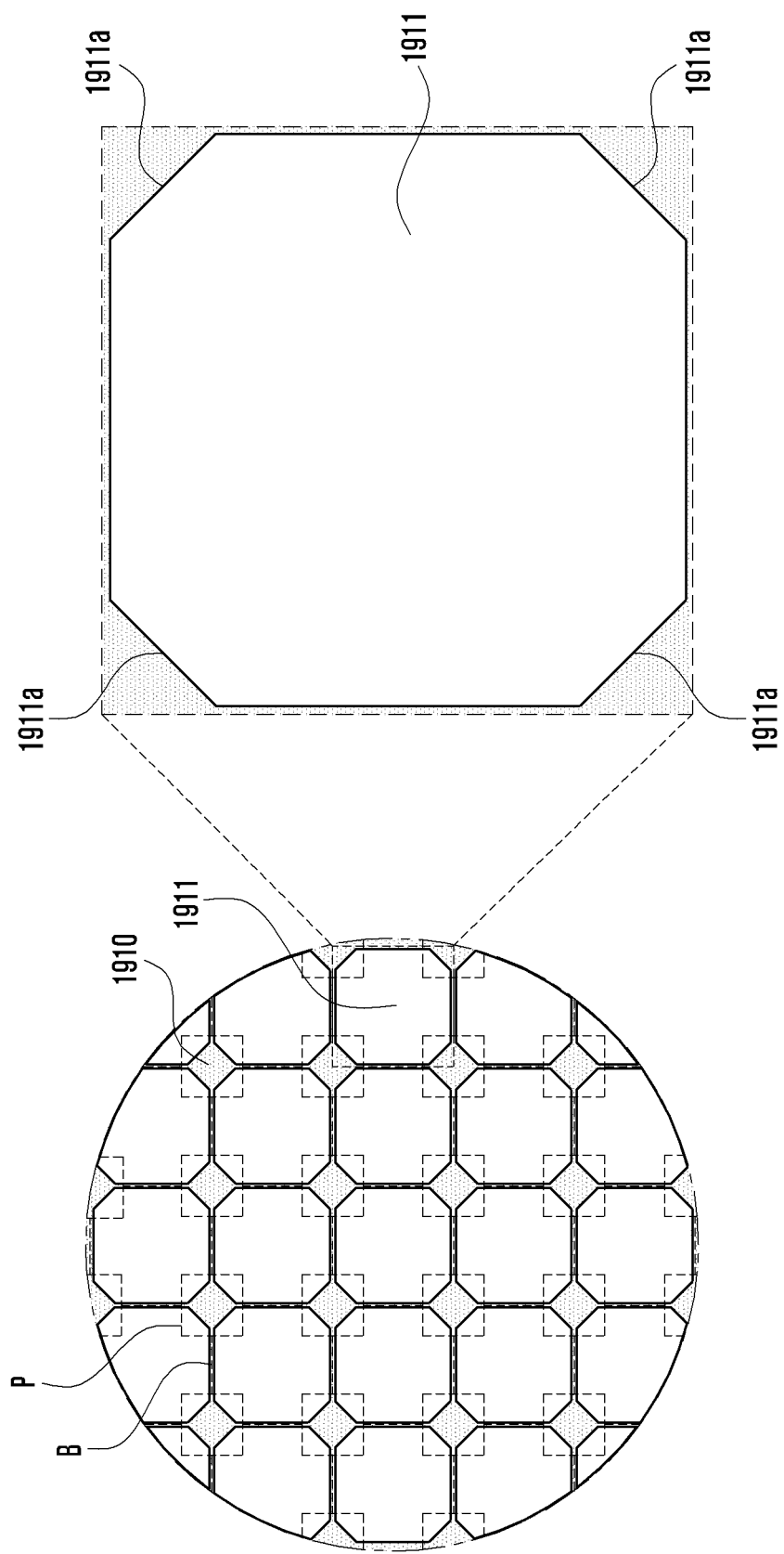

Referring to FIG. 19A, an opaque layer 1910 may have a plurality of openings 1911 arranged at regular intervals. According to an embodiment, each of the plurality of openings 1911 may be formed to have inclined straight edges 1911*a* at four corners, based on the square-shape openings 1311 shown in FIG. 13A.

Figure 20A:
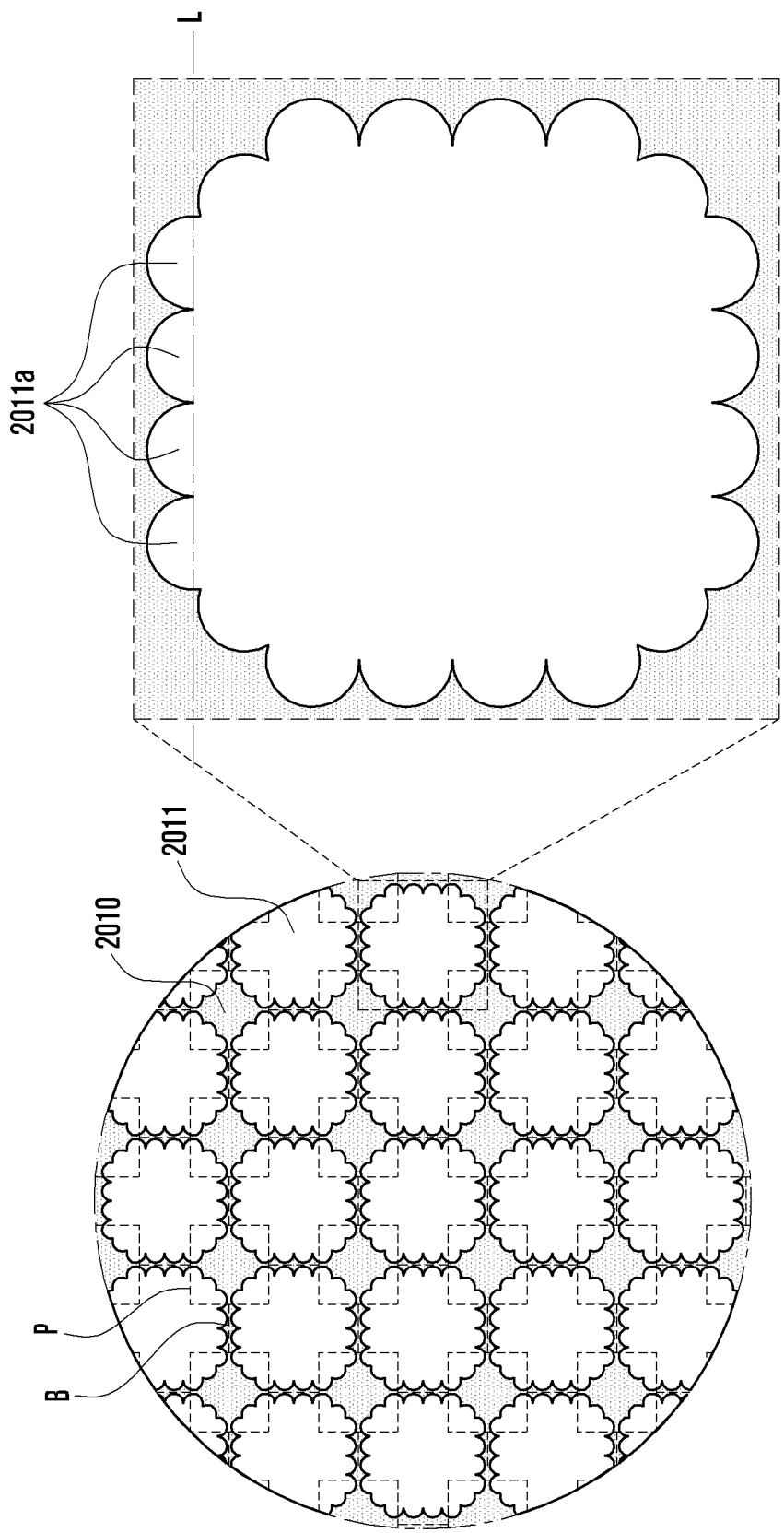

Referring to FIG. 20A, an opaque layer 2010 may have a plurality of openings 2011 arranged at regular intervals. According to an embodiment, each of the plurality of openings 2011 may be formed to have a plurality of protrusions 2011*a* along all edges, including the inclined straight edges 1911*a*, of the opening 1911 shown in FIG. 19A.

Figure 19B:
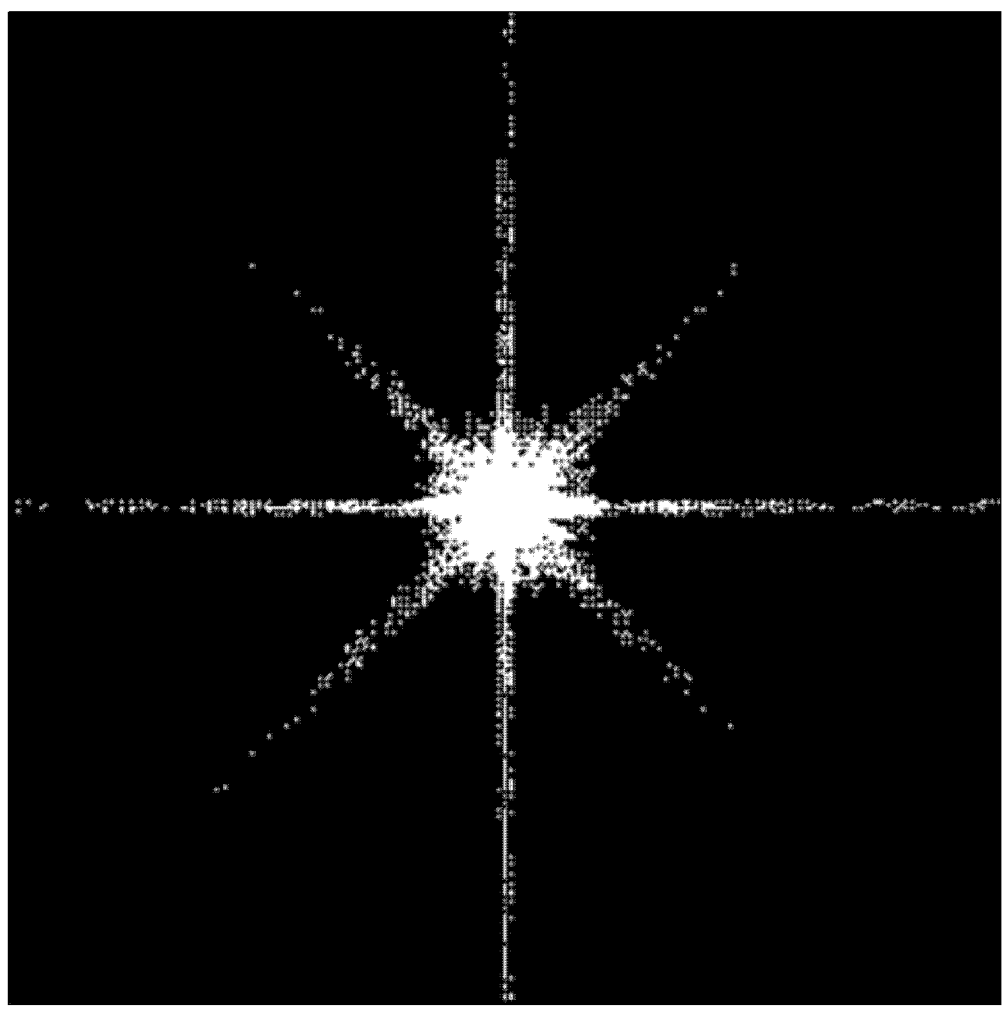
Figure 20B:
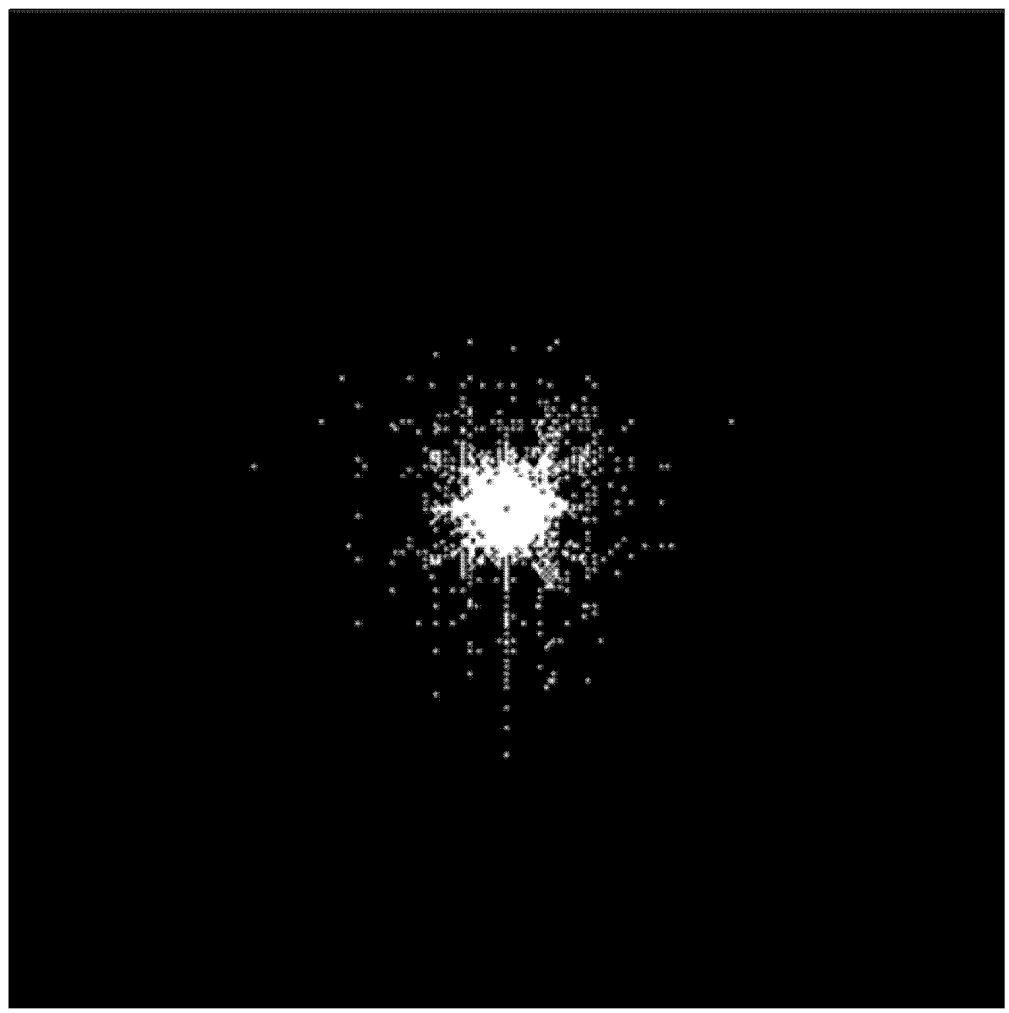

Referring to FIGS. 19B and 20B, it can be seen that the degree of diffraction of light in the transmission area (e.g., the transmission area A1 in FIG. 6) is varied depending on the presence or absence of the plurality of protrusions 2011*a*. That is, the transmission area containing the openings 2011 of FIG. 20A with a favorable shape for light scattering by the protrusions 2011*a* has a smaller degree of diffraction of light compared to the transmission area containing the openings 1911 of FIG. 19A with a relatively unfavorable shape for light scattering by having the straight edges 1911*a*. This means that the quality of an image captured by the camera device (e.g., the camera device 500 in FIG. 5A) is better in case of FIG. 20A.

Figure 19C:
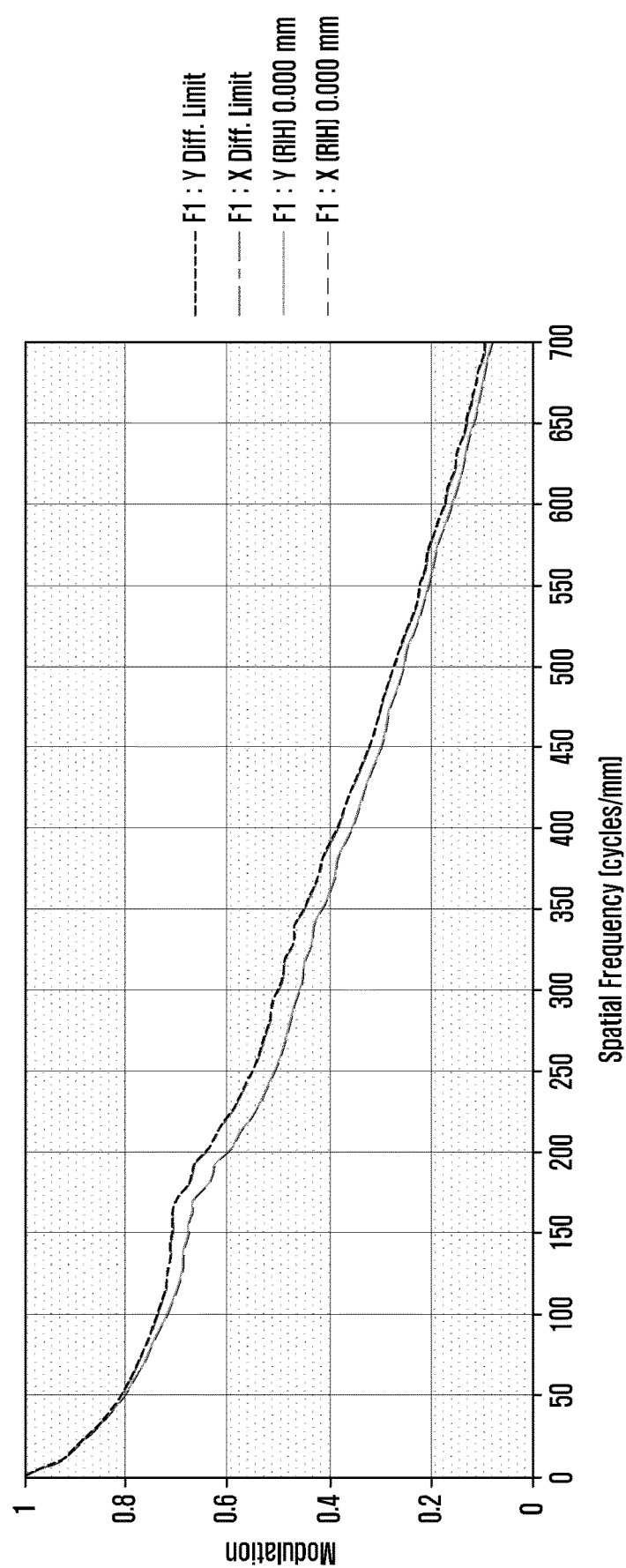
Figure 20C:
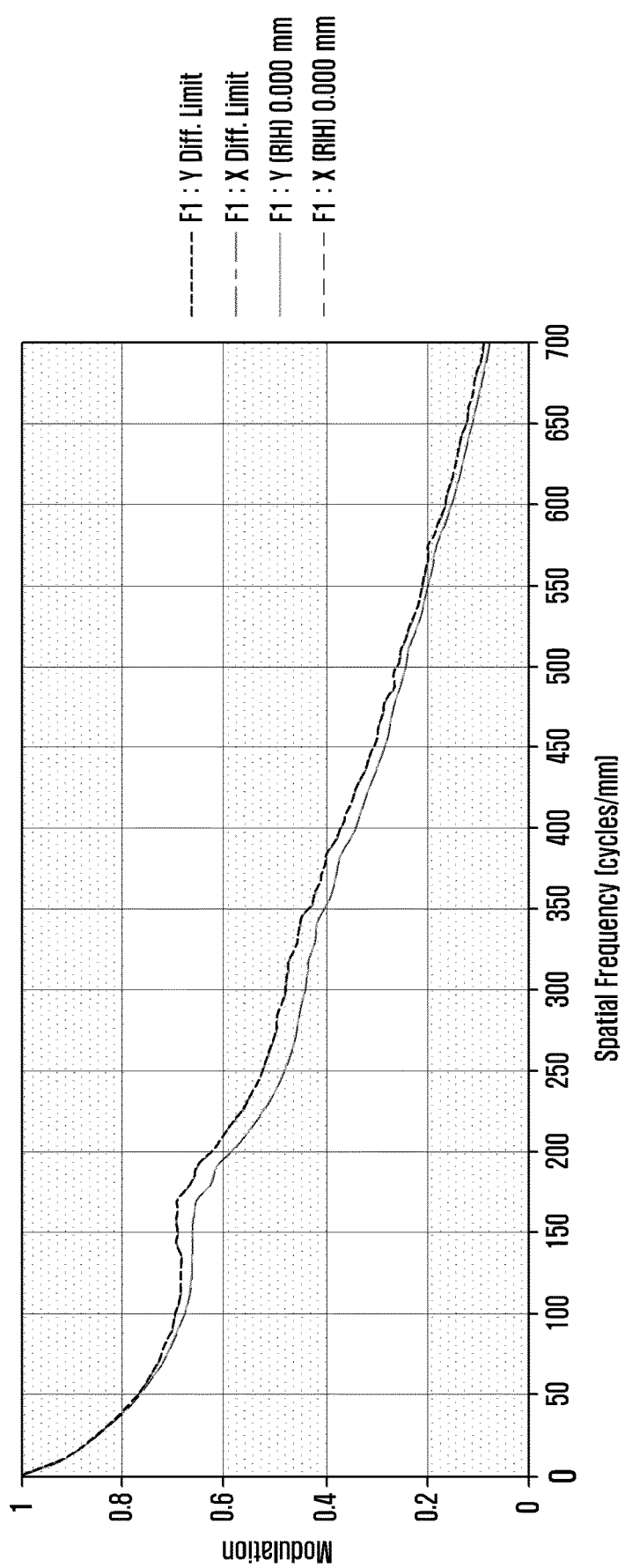

Referring to FIGS. 19C and 20C, it can be seen that the MTF performance of the transmission area by the openings 1911 and 2011 is not varied regardless of the presence or absence of the plurality of protrusions 1911*a*.

As fully described so far, according to various embodiments of the disclosure, forming the plurality of openings (e.g., the openings 461 in FIG. 6) in the opaque layer (e.g., the opaque layer 460 in FIG. 6) disposed under the display panel (e.g., the display panel 431 in FIG. 6) while suitably adjusting the shape, size, arrangement density, and/or arrangement interval of the openings can enable the camera device (e.g., the camera device 500 in FIG. 5A) to provide an improved image by reducing the degree of diffraction of incident light while maintaining high MTF characteristics in the transmission area (e.g., the transmission area A1 in FIG. 6).

In other words, by providing the opaque layer having the plurality of openings under the display panel and by appropriately adjusting the shape, size, arrangement density, and/or arrangement interval of the plurality of openings, it is possible to reduce the degree of diffraction of light incident through the transmission area and exhibit excellent MTF characteristics. Accordingly, it is possible to obtain an image of excellent quality through the camera device.

According to various embodiments, an electronic device (e.g., the electronic device 100 in FIG. 1) may include a housing (e.g., the housing 110 in FIG. 1) having an inner space (e.g., the inner space 3001 in FIG. 5A), a display panel (e.g., the display panel 431 in FIG. 6) disposed in the inner space of the housing to be visible from an outside and including a transmission area (e.g., the transmission area A1 in FIG. 6) formed as a part of an active area thereof, and a camera device (e.g., the camera device 500 in FIG. 5A) disposed under the display panel such that the transmission area of the display panel is overlapped with an angle of view (e.g., the angle of view (θ) in FIG. 5B) of the camera device. The transmission area may contain a plurality of pixels (the plurality of pixels P in FIG. 6) and/or a plurality of wirings (e.g., the plurality of wirings B in FIG. 7A) having an arrangement density lower than in a surrounding active area (e.g., the surrounding active area A2 in FIG. 6) when the display panel is viewed from above. The display panel may include an opaque layer (e.g., the opaque layer 460 in FIG. 6) disposed thereunder, having a plurality of openings (e.g., the plurality of opening 461 in FIG. 6), and overlapped with the transmission area when the display panel is viewed from above.

According to various embodiments, the plurality of pixels and/or the plurality of wirings may be arranged to avoid the plurality of openings when the display panel is viewed from above.

According to various embodiments, the plurality of pixels and/or the plurality of wirings may be arranged to be overlapped, at least in part, with the plurality of openings when the display panel is viewed from above.

According to various embodiments, the opaque layer may include a opaque metal layer disposed under the display panel to correspond to the transmission area.

According to various embodiments, the opaque metal layer may include a deposition layer of black color formed on a rear surface of the display panel.

According to various embodiments, a degree of diffraction of light incident through the transmission area may be determined depending on a shape, size, arrangement density, and/or arrangement interval of the plurality of openings.

According to various embodiments, the plurality of openings may have same or different shapes, sizes, and/or arrangement intervals.

According to various embodiments, through the plurality of openings, the display panel may have, in the transmission area, a transmittance corresponding to a pixel arrangement density in a range of about 100 pixel per inch (ppi) to about 300 ppi.

According to various embodiments, through the plurality of openings, the display panel may have, in the transmission area, a transmittance greater than a transmittance of the surrounding active area and smaller than a transmittance corresponding to a pixel arrangement density that one pixel is disposed in an area capable of accommodating 16 pixels among the plurality of pixels.

According to various embodiments, through the plurality of openings, the display panel may have, in the transmission area, a transmittance corresponding to a pixel arrangement density that one pixel is disposed in an area capable of accommodating 4 pixels among the plurality of pixels.

According to various embodiments, in the transmission area of the display panel, a ratio of a transmission portion formed by the plurality of openings to a non-transmission portion formed by the opaque layer may range from about 1 to 500.

According to various embodiments, each of the plurality of openings may have at least in part a plurality of internal angles, and at least one of the plurality of internal angles is 90 degrees or more.

According to various embodiments, an interval between adjacent openings among the plurality of openings may be determined to have a range of about $1/10$ to $1/2$ of a size of a unit pixel among the plurality of pixels.

According to various embodiments, a size of each of the plurality of openings may be determined to have a range of about $1/10$ to $1/2$ of a size of a unit pixel among the plurality of pixels.

According to various embodiments, each of the plurality of openings may include a plurality of protrusions that protrude outward from an imaginary straight line forming at least partially a side of the opening.

According to various embodiments, the plurality of protrusions may be formed in curved shapes to have equal or unequal radius of curvature.

According to various embodiments, each of the plurality of protrusions may be formed to have a radius of curvature of $1/40$ or more of a length of one side of the opening.

According to various embodiments, each of the plurality of protrusions may be formed to have a polygonal shape consisting of at least two small sides and at least one internal angle therebetween.

According to various embodiments, each of the at least one internal angle may be formed to be about 10 degrees or more.

According to various embodiments, each of the at least two small sides may be formed to have a length of $1/20$ or more of a length of the one side of the opening.

While the disclosure has been shown and described with reference to certain various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing having an inner space;
a display panel disposed in the inner space of the housing and being visible from an outside, the display panel comprising a transmission area formed as a part of an active area thereof; and
a camera device disposed under the display panel, the transmission area of the display panel overlapping with an angle of view of the camera device,
wherein the transmission area contains a first arrangement of a plurality of pixels or a plurality of wirings and the active area surrounding the transmission area contains a second arrangement of a plurality of pixels or a plurality of wirings, the first arrangement having an arrangement density lower than the second arrangement when the display panel is viewed from above,
wherein the display panel further comprises an opaque layer disposed thereunder, the opaque layer comprising a plurality of openings and overlapping with the transmission area when the display panel is viewed from above, and
wherein the plurality of pixels or the plurality of wirings of the transmission area and/or the plurality of openings of the opaque layer are arranged at regular intervals in the transmission area when the display panel is viewed from above.

2. The electronic device of claim 1, wherein the plurality of pixels or the plurality of wirings of the transmission area are arranged to avoid the plurality of openings when the display panel is viewed from above.

3. The electronic device of claim 1, wherein the plurality of pixels or the plurality of wirings of the transmission area are arranged to be overlapped, at least in part, with the plurality of openings when the display panel is viewed from above.

4. The electronic device of claim 1, wherein the opaque layer comprises an opaque metal layer disposed under the display panel in a region corresponding to the transmission area.

5. The electronic device of claim 4, wherein the opaque metal layer comprises a deposition layer of black color formed on a rear surface of the display panel.

6. The electronic device of claim 1, wherein a degree of diffraction of light incident through the transmission area is determined based on at least one of a shape, a size, an arrangement density, or an arrangement interval of the plurality of openings.

7. The electronic device of claim 1, wherein the plurality of openings have at least one of different shapes, sizes, or arrangement intervals.

8. The electronic device of claim 1, wherein through the plurality of openings, the display panel has, in the transmission area, a transmittance corresponding to a pixel arrangement density in a range of about 100 pixel per inch (ppi) to about 300 ppi.

9. The electronic device of claim 1, wherein through the plurality of openings, the display panel has, in the transmission area, a transmittance greater than a transmittance of the active area surrounding the transmission area and smaller than a transmittance corresponding to a pixel arrangement density that one pixel is disposed in an area capable of accommodating 16 pixels among the plurality of pixels.

10. The electronic device of claim 9, wherein through the plurality of openings, the display panel has, in the transmission area, a transmittance corresponding to a pixel arrangement density that one pixel is disposed in an area capable of accommodating 4 pixels among the plurality of pixels.

11. The electronic device of claim 1, wherein in the transmission area of the display panel, a ratio of a transmission portion formed by the plurality of openings to a non-transmission portion formed by the opaque layer ranges from about 1 to 500.

12. The electronic device of claim 1, wherein each of the plurality of openings has at least in part a plurality of internal angles, and at least one of the plurality of internal angles is 90 degrees or more.

13. The electronic device of claim 1, wherein an interval between adjacent openings among the plurality of openings is determined to have a range of about $1/10$ to $1/2$ of a size of a unit pixel among the plurality of pixels.

14. The electronic device of claim 1, wherein a size of each of the plurality of openings is determined to have a range of about 1/10 to 1/2 of a size of a unit pixel among the plurality of pixels.

15. The electronic device of claim 1, wherein each of the plurality of openings comprises a plurality of protrusions that protrude outward from an imaginary straight line forming at least partially a side of a corresponding opening.

16. The electronic device of claim 15, wherein the plurality of protrusions are formed in curved shapes to have equal or unequal radius of curvature.

17. The electronic device of claim 16, wherein each of the plurality of protrusions is formed to have a radius of curvature of 1/40 or more of a length of one side of the corresponding opening.

18. The electronic device of claim 15, wherein each of the plurality of protrusions is formed to have a polygonal shape consisting of at least two small sides and at least one internal angle therebetween.

19. The electronic device of claim 18, wherein each of the at least one internal angle is formed to be about 10 degrees or more.

20. The electronic device of claim 18, wherein each of the at least two small sides is formed to have a length of 1/20 or more of a length of the side of the corresponding opening.

21. The electronic device of claim 1, wherein the plurality of openings have at least one of same shapes, same sizes, or same arrangement intervals.

22. The electronic device of claim 1, wherein the opaque layer is disposed between a top surface of the display panel and a top surface of the camera device, and wherein the plurality of openings of the opaque layer and the plurality of pixels or plurality of wirings of the transmission area do not overlap when the display panel is viewed from above.

23. The electronic device of claim 1, wherein the plurality of openings of the opaque layer in the transmission area are spaced apart at regular intervals in the transmission area when the display panel is viewed from above.

* * * * *